US011756907B2

(12) United States Patent
Chen et al.

(10) Patent No.: US 11,756,907 B2
(45) Date of Patent: *Sep. 12, 2023

(54) BONDING STRUCTURE AND METHOD OF FORMING SAME

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Hsien-Wei Chen, Hsinchu (TW); Jie Chen, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/673,953

(22) Filed: Feb. 17, 2022

(65) Prior Publication Data

US 2022/0173059 A1    Jun. 2, 2022

Related U.S. Application Data

(63) Continuation of application No. 16/929,708, filed on Jul. 15, 2020, now Pat. No. 11,264,343.

(60) Provisional application No. 62/893,971, filed on Aug. 30, 2019.

(51) Int. Cl.
*H01L 23/00* (2006.01)
*H01L 21/768* (2006.01)
*H01L 23/538* (2006.01)

(52) U.S. Cl.
CPC ........ *H01L 24/05* (2013.01); *H01L 21/76843* (2013.01); *H01L 21/76879* (2013.01); *H01L 23/5384* (2013.01)

(58) Field of Classification Search
CPC .............. H01L 24/05; H01L 21/76879; H01L 21/76843; H01L 23/5384; H01L 23/5226; H01L 23/528; H01L 24/06; H01L 24/09; H01L 23/481; H01L 24/80
See application file for complete search history.

(56) References Cited

U.S. PATENT DOCUMENTS

| 8,993,380 B2 | 3/2015 | Hou et al. |
| 9,000,584 B2 | 4/2015 | Lin et al. |
| 9,048,222 B2 | 6/2015 | Hung et al. |

(Continued)

FOREIGN PATENT DOCUMENTS

| CN | 114464576 A | * 5/2022 | ......... H01L 21/4857 |
| JP | 2019134118 A | 8/2019 | |

(Continued)

*Primary Examiner* — Mamadou L Diallo
(74) *Attorney, Agent, or Firm* — Slater Matsil, LLP

(57) ABSTRACT

A package includes a first die that includes a first metallization layer, one or more first bond pad vias on the first metallization layer, wherein a first barrier layer extends across the first metallization layer between each first bond pad via and the first metallization layer, and one or more first bond pads on the one or more first bond pad vias, wherein a second barrier layer extends across each first bond pad via between a first bond pad and the first bond pad via, and a second die including one or more second bond pads, wherein a second bond pad is bonded to a first bond pad of the first die.

20 Claims, 28 Drawing Sheets

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,504,873 B1* | 12/2019 | Chen | H01L 25/16 |
| 2009/0227101 A1 | 9/2009 | Jung et al. | |
| 2010/0109106 A1* | 5/2010 | Zhong | H01L 43/12 |
| | | | 257/E29.323 |
| 2010/0187670 A1* | 7/2010 | Lin | H01L 21/76898 |
| | | | 257/E23.101 |
| 2011/0101523 A1 | 5/2011 | Hwang et al. | |
| 2013/0320536 A1* | 12/2013 | Cooney, III | H01L 21/76879 |
| | | | 257/E23.141 |
| 2014/0353828 A1* | 12/2014 | Edelstein | H01L 24/03 |
| | | | 257/751 |
| 2017/0358553 A1 | 12/2017 | Kim et al. | |
| 2018/0012868 A1* | 1/2018 | Huang | H01L 24/94 |
| 2019/0096817 A1* | 3/2019 | Yu | H01L 23/3128 |
| 2019/0148336 A1 | 5/2019 | Chen et al. | |
| 2019/0237361 A1 | 8/2019 | Usami | |
| 2019/0245543 A1 | 8/2019 | Lee et al. | |
| 2019/0385982 A1* | 12/2019 | Lee | H01L 24/80 |
| 2020/0035736 A1* | 1/2020 | Nagahama | H01L 21/76843 |
| 2020/0161277 A1* | 5/2020 | Lee | H01L 21/76898 |
| 2020/0286875 A1* | 9/2020 | Nishida | H01L 24/09 |
| 2020/0286905 A1* | 9/2020 | Kai | H01L 29/40117 |
| 2020/0328112 A1* | 10/2020 | Yang | H01L 23/5226 |
| 2020/0343218 A1* | 10/2020 | Hu | H01L 24/08 |
| 2020/0343293 A1* | 10/2020 | Kawano | H01L 21/76849 |
| 2021/0028148 A1* | 1/2021 | Wu | H01L 21/7682 |

FOREIGN PATENT DOCUMENTS

| | | |
|---|---|---|
| KR | 200900095312 A | 9/2009 |
| KR | 20190036485 A | 4/2019 |
| KR | 20190055694 A | 5/2019 |
| TW | 201742222 A | 12/2017 |
| WO | 2018186026 A1 | 10/2018 |

* cited by examiner

BONDING STRUCTURE AND METHOD OF FORMING SAME

PRIORITY CLAIM AND CROSS-REFERENCE

This application is a continuation of U.S. application Ser. No. 16/929,708, filed on Jul. 15, 2020, now U.S. Pat. No. 11,264,343, entitled "Bonding Structure and Method of Forming Same," which claims the benefits of U.S. Provisional Application No. 62/893,971, filed on Aug. 30, 2019, each application being hereby incorporated herein by reference in its entirety.

BACKGROUND

In wafer-to-wafer bonding technology, various methods have been developed to bond two package components (such as wafers) together. Some wafer bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
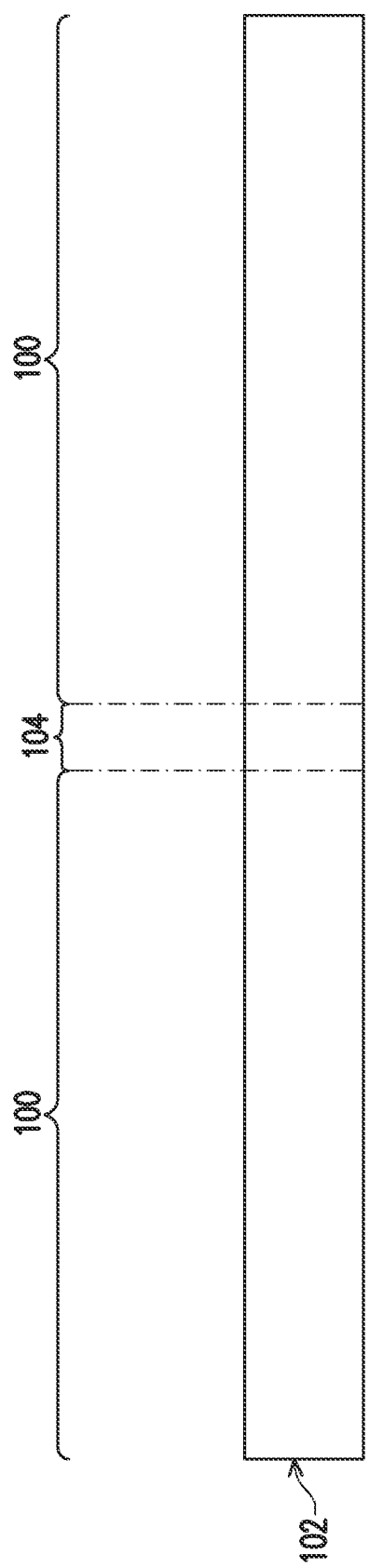
FIGS. 1-9 illustrate cross-sectional views of intermediate steps in a process for forming a device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bonding structure and method is provided, in accordance with some embodiments. Bond pad vias (BPVs) are formed over metal pads in a series of processing steps, and then bond pads are formed over the BPVs in a subsequent series of processing steps. By forming the BPVs and the bond pads separately, the metal pads to which the BPVs are connected may be formed closer together and/or having a smaller area. Additionally, the BPVs or the bond pads may also be formed closer together and/or with a smaller area. This can reduce the size of a die or package. The corresponding bond pads of two bonded dies may be formed having different areas such that misalignment between the two dies has little or no effect on the contact resistance at the connection between the corresponding bond pads.

Figure 7:
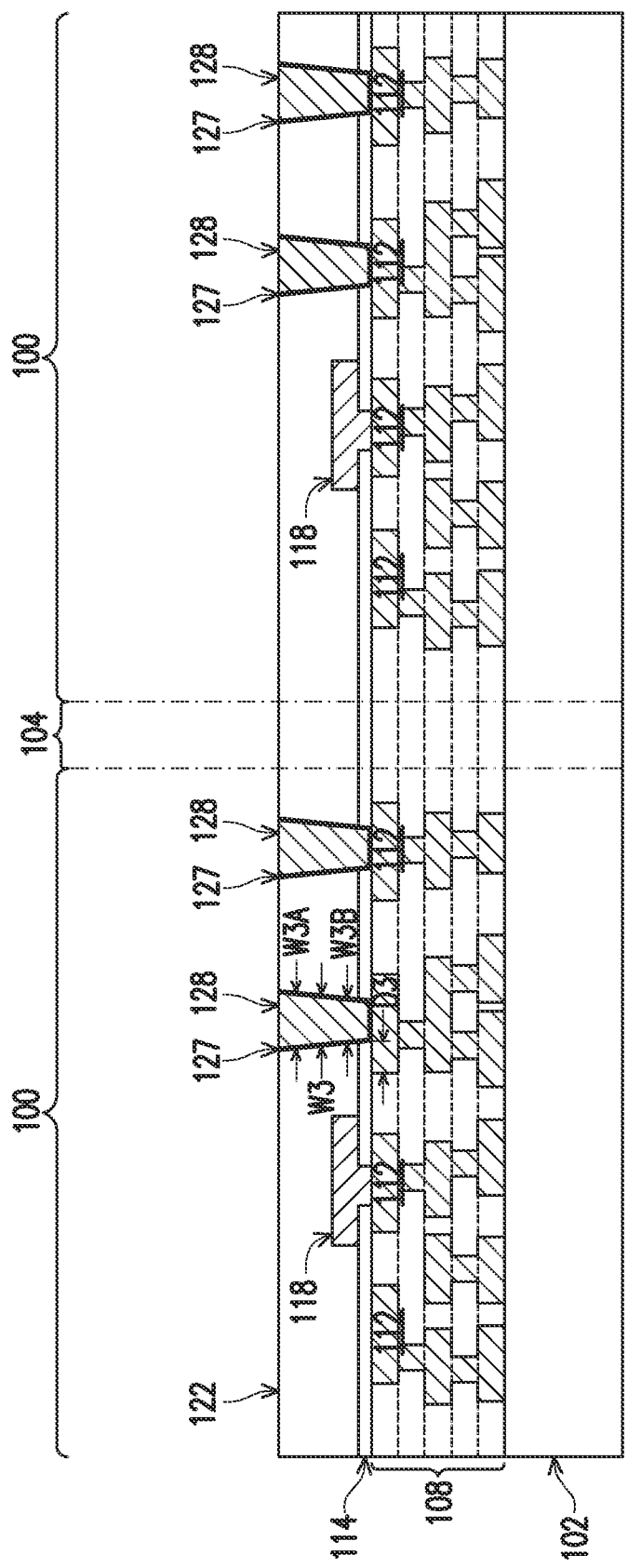
Figure 8:
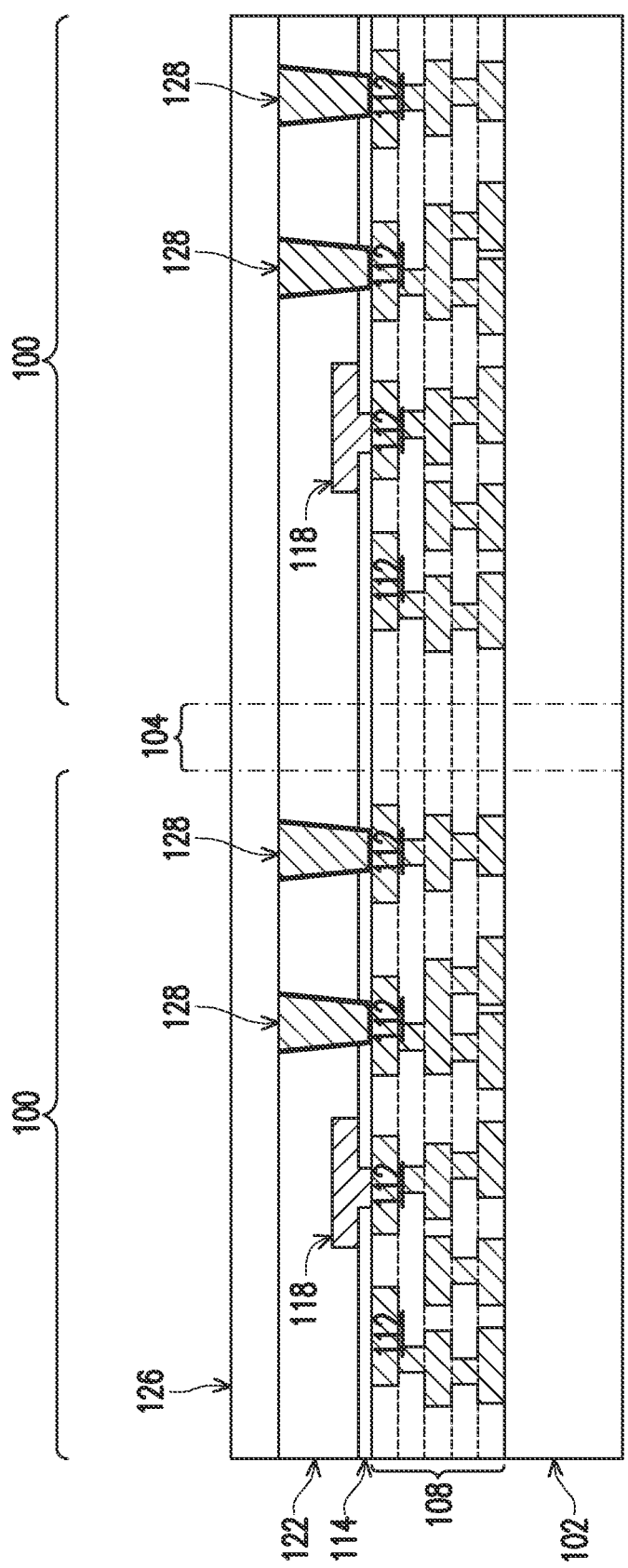
Figure 9:
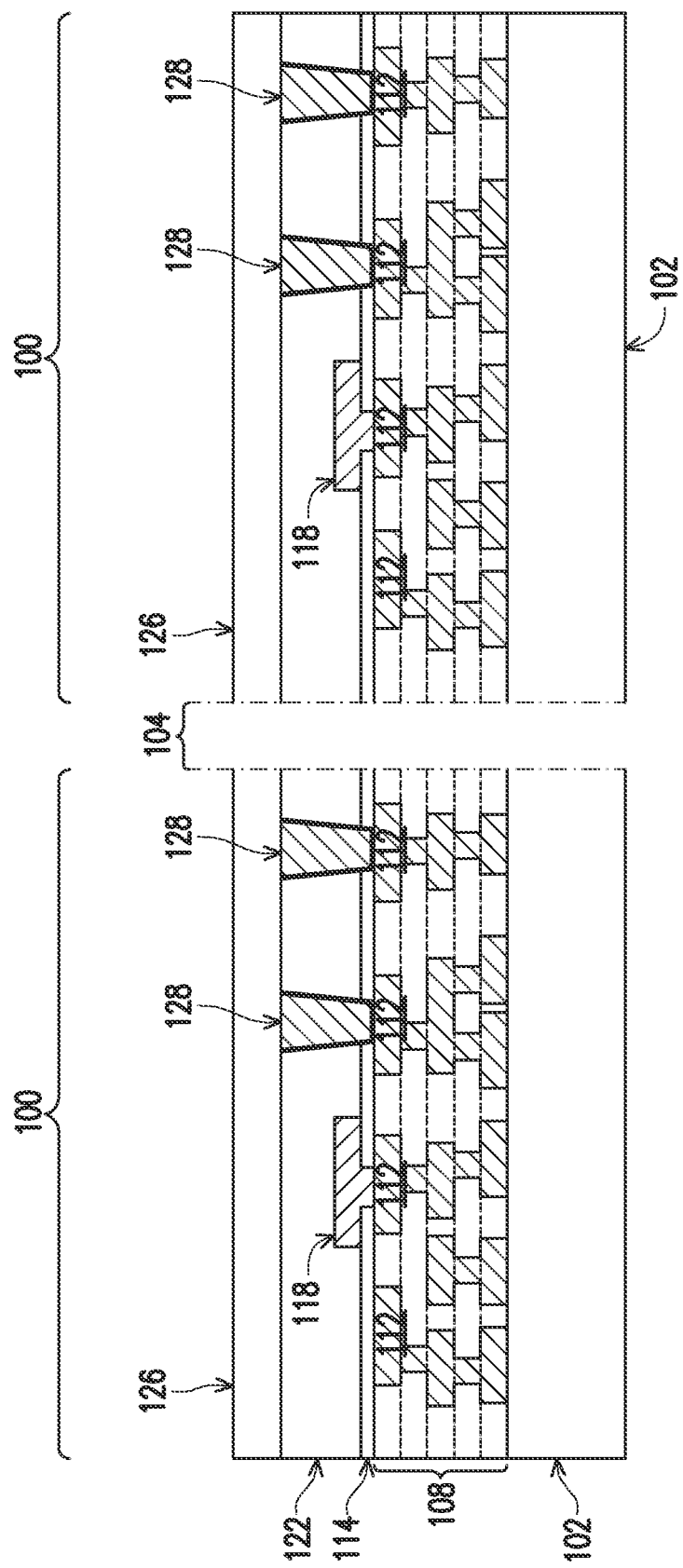

FIGS. 1-9 illustrate cross-sectional views of intermediate stages in the formation of a device structure 100 (see FIG. 9), in accordance with some embodiments. FIG. 1 illustrates a substrate 102, in accordance with some embodiments. In FIGS. 1-9, multiple device structures 100 are formed on a single substrate 102 and then singulated to form individual device structures 100, in accordance with some embodiments. The regions labeled "100" in FIGS. 1-8 indicate regions where the device structures 100 shown in FIG. 9 are formed, and the region labeled "104" indicates a scribe line region 104 between adjacent device structures 100.

The substrate 102 may be a semiconductor substrate, such as a bulk semiconductor, a semiconductor-on-insulator (SOI) substrate, a semiconductor wafer, or the like, which may be doped (e.g., with a p-type or an n-type dopant) or undoped. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 102 and features formed thereon are used to form a device die, integrated circuit die, or the like. In such embodiments, integrated circuit devices may be formed on the top surface of the substrate 102. Exemplary integrated circuit devices may include complementary metal-oxide semiconductor (CMOS) transistors, fin field-effect transistors (FinFETs), resistors, capacitors, diodes, the like, or a combination thereof. The details of the integrated circuit devices are not illustrated herein. In other embodiments, the substrate 102 is used for forming an interposer structure. In such embodiments, no active devices such as transistors are formed on the substrate 102. Passive devices such as capacitors, resistors, inductors, or the like may be formed in the substrate 102. The substrate 102 may also be a dielectric substrate in some embodiments in which the substrate 102 is part of an interposer structure. In some embodiments, through vias (not shown) may be formed extending through the substrate 102 in order to interconnect components on the opposite sides of the substrate 102.

Figure 2:
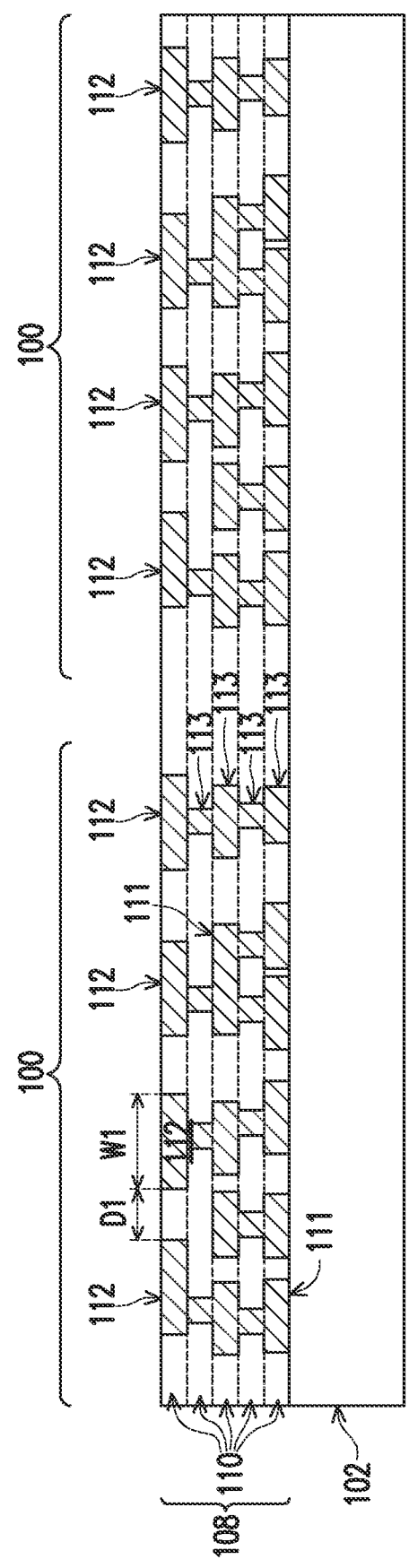

In FIG. 2, an interconnect structure 108 is formed over the substrate 102, in accordance with some embodiments. The interconnect structure 108 provides routing and electrical connections between devices formed in the substrate 102, and may be, e.g., a redistribution structure or the like. The interconnect structure 108 may include a plurality of insulating layers 110, which may be inter-metal dielectric (IMD) layers, described in greater detail below. Each of the insulating layers 110 includes one or more conductive features 113, which may be metal lines and/or vias formed therein in a metallization layer. In other embodiments, the metal lines may be, for example, redistribution layers. The conductive features 113 may be electrically connected to the active and/or passive devices of the substrate 102 by the contacts (not shown in the Figures).

Some portions of the conductive features 113 formed in the topmost insulating layer 110 of the interconnect structure 108 may be formed having relatively larger area than the other conductive features 113 within the interconnect structure 108. The conductive features of the interconnect structure 108 that are formed in the topmost insulating layer 110 are separately labeled as metal pads 112 in FIG. 2. The metal pads 112 may be utilized as for connecting subsequently formed conductive features (e.g., conductive pads 118, bond pad vias (BPVs) 128, or the like) to the interconnect structure 108. In some embodiments, the conductive features of the topmost insulating layer 110 may also comprise metal lines or vias, which are not separately shown in FIG. 2. The metal pads 112 may be formed having a width W1 that is between about 2 µm and about 10 µm or having an area that is between about 4 µm² and about 100 µm². Adjacent metal pads 112 may be separated by a distance D1 that is between about 2 µm and about 20 µm. Other dimensions or distances are possible. In some cases, the techniques described herein may allow for metal pads 112 having a smaller width W1 or a smaller area. In some cases, the techniques described herein may allow for forming metal pads 112 that are separated by a smaller distance D1. By forming a smaller or closer metal pads 112, the dimensions (e.g. the "footprint") of the device structure 100 may be reduced. Additionally, the routing distance between features may be reduced, which can improve higher speed operation of the device structure 100.

In some embodiments, the insulating layers 110 may be formed from a low-k dielectric material having a k-value lower than about 3.0. The insulating layers 110 may be formed from an extra-low-k (ELK) dielectric material having a k-value of less than 2.5. In some embodiments, the insulating layers 110 may be formed from an oxygen-containing and/or carbon containing low-k dielectric material, Hydrogen SilsesQuioxane (HSQ), MethylSilsesQuioxane (MSQ), the like, or a combination thereof. In some embodiments, some or all of insulating layers 110 are formed of non-low-k dielectric materials such as silicon oxide, silicon carbide (SiC), silicon carbonitride (SiCN), silicon oxycarbonitride (SiOCN), or the like. In some embodiments, etch stop layers (not shown), which may be formed of silicon carbide, silicon nitride, or the like, are formed between insulating layers 110. In some embodiments, the insulating layers 110 are formed from a porous material such as SiOCN, SiCN, SiOC, SiOCH, or the like, and may be formed by spin-on coating or a deposition process such as plasma enhanced chemical vapor deposition (PECVD), CVD, PVD, or the like. In some embodiments, the interconnect structure 108 may include one or more other types of layers, such as diffusion barrier layers (not shown).

In some embodiments, the interconnect structure 108 may be formed using a single and/or a dual damascene process, a via-first process, or a metal-first process. In an embodiment, an insulating layer 110 is formed, and openings (not shown) are formed therein using acceptable photolithography and etching techniques. Diffusion barrier layers (not shown) may be formed in the openings and may include a material such as TaN, Ta, TiN, Ti, CoW, or the like, and may be formed in the openings using a deposition process such as CVD, Atomic Layer Deposition (ALD), or the like. A conductive material may be formed in the openings from copper, aluminum, nickel, tungsten, cobalt, silver, combinations thereof, or the like, and may be formed over the diffusion barrier layers in the openings using an electrochemical plating process, CVD, ALD, PVD, the like, or a combination thereof. After formation of the conductive material, excess conductive material may be removed using, for example, a planarization process such as CMP, thereby leaving conductive features 113 in the openings of the respective insulating layer 110. The process may then be repeated to form additional insulating layers 110 and conductive features 113 therein. In some embodiments, the topmost insulating layer 110 and the metal pads 112 formed therein may be formed having a thickness greater than a thickness of the other insulating layers 110 of the interconnect structure 108. In some embodiments, one or more of the topmost conductive features are dummy metal lines or dummy metal pads 112 that are electrically isolated from the substrate 102.

Figure 3:
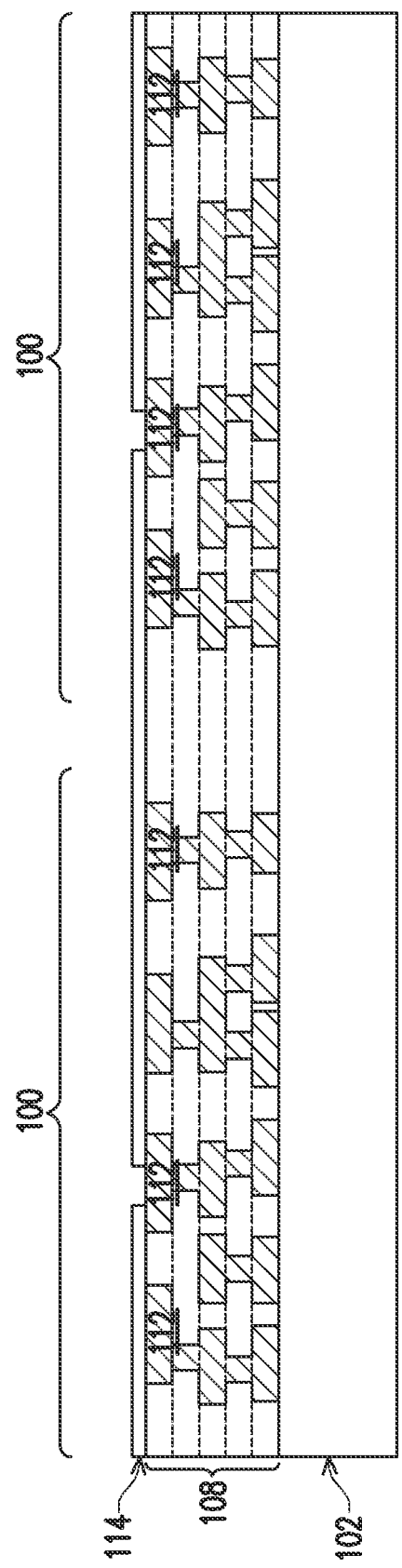

In FIG. 3, a passivation layer 114 is formed over the interconnect structure 108, and one or more openings are formed in the passivation layer 114. The passivation layer 114 may comprise one or more layers of one or more materials. For example, the passivation layer 114 may include one or more layers of silicon nitride, silicon oxide, silicon oxynitride, the like, or a combination. The passivation layer 114 may be formed using a suitable process such as CVD, PECVD, PVD, ALD, the like, or a combination thereof. In some embodiments, the passivation layer 114 may be formed having a thickness greater than a thickness of the topmost insulating layer 110. The openings in the passivation layer 114 may be formed using a suitable photolithographic and etching process. For example, a photoresist may be formed over the passivation layer 114 and patterned, and then the patterned photoresist used as an etching mask. The passivation layer 114 may be etching using a suitable wet etching process and/or dry etching process. The openings are formed to expose portions of the metal pads 112 for electrical connection.

Figure 4:
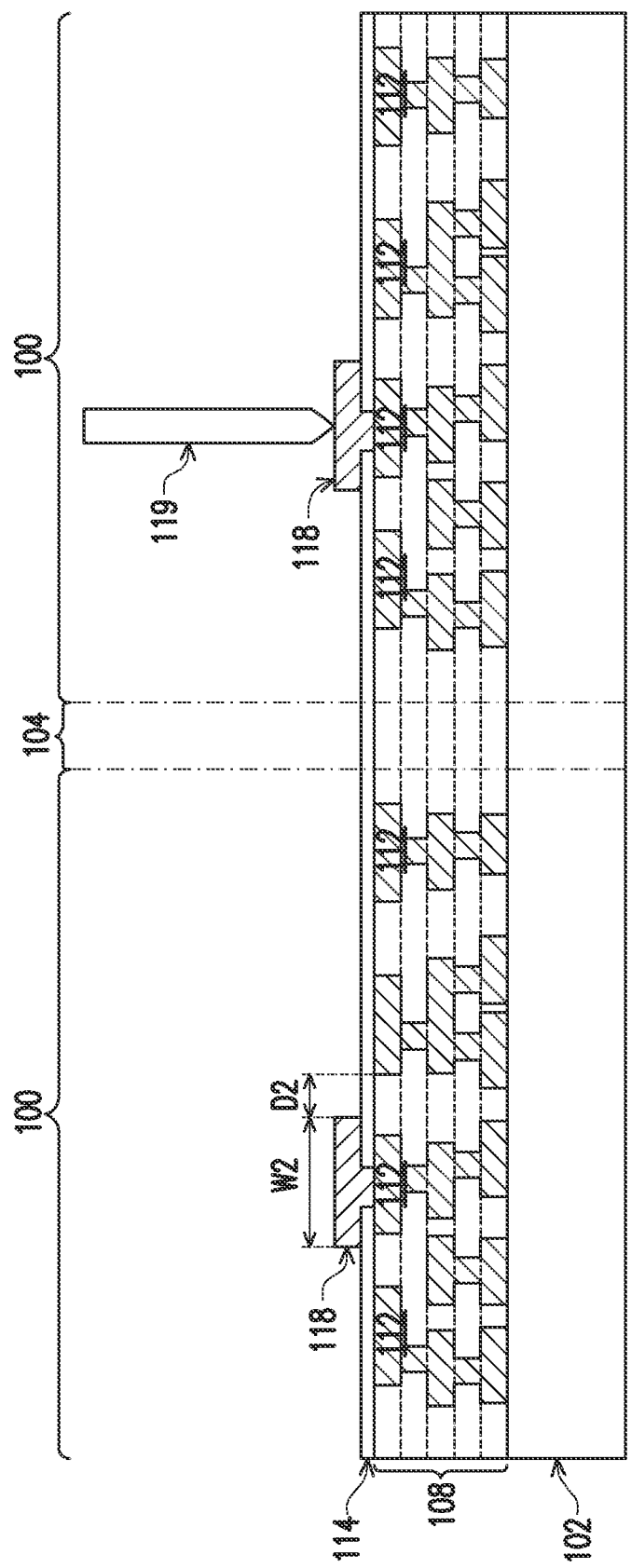

In FIG. 4, conductive pads 118 are formed over the passivation layer 114 in accordance with some embodiments. One or more conductive pads 118 may be formed extending through the openings in the passivation layer 114 to make electrical connection with one or more of the metal pads 112 of the interconnect structure 108. In some embodiments, the conductive pads 118 may be formed by first depositing a blanket layer of a conductive material such as aluminum. For example, CVD, PVD, or the like may be used to deposit a layer of aluminum over the passivation layer 114, the openings, and the metal pads 112. A photoresist layer (not separately illustrated) may then be formed over the aluminum layer and the aluminum layer may be etched to form the conductive pads 118. Conductive pads 118 formed from aluminum in this manner may be referred to as "aluminum pads."

In other embodiments, the conductive pads 118 are formed by first forming a seed layer over the passivation layer 114 and the openings. In some embodiments, the seed layer is a metal layer comprising one or more layers, which may be formed of different materials. The seed layer may be formed using, for example, PVD or the like. A photoresist is formed and patterned on the seed layer and conductive material is formed in the openings of the photoresist and on the exposed portions of the seed layer. In some embodiments, the conductive material may be formed using a plating process, such as using an electroplating or electroless plating process, or the like. The conductive material may include one or more materials such as copper, titanium, tungsten, gold, cobalt, the like, or a combination thereof. The photoresist and portions of the seed layer on which the conductive material is not formed are then removed using, for example, a suitable ashing or stripping process, such as using an oxygen plasma or the like. Once the photoresist is removed, remaining exposed portions of the seed layer may be removed using an acceptable etching process, such as a wet etching process or a dry etching process. The remaining portions of the seed layer and conductive material form the conductive pads 118. The conductive pads 118 may be formed using other techniques in other embodiments, and all such techniques are considered within the scope of this disclosure.

In some embodiments, the conductive pads 118 that are electrically connected to the interconnect structure 108 may be used as test pads before additional processing steps are performed. For example, the conductive pads 118 may be probed as part of a wafer-acceptance-test, a circuit test, a Known Good Die (KGD) test, or the like. The probing may be performed to verify the functionality of the active or passive devices of the substrate 102 or the respective electrical connections within the substrate 102 or interconnect structure 108 (e.g., the conductive features 113). The probing may be performed by contacting a probe needle 119 to the conductive pads 118. The probe needle 119 may be a part of a probe card that includes multiple probe needles 119 which, for example, may be connected to testing equipment.

In some embodiments, the conductive material of the conductive pads 118 may be different than the conductive material of the metal pads 112. For example, the conductive pads 118 may be aluminum and the metal pads 112 may be copper, though other conductive materials may be used. In some embodiments, the conductive pads 118 may have a width W2 between about 2 μm and about 30 μm or a length (e.g., perpendicular to the width) between about 20 μm and about 100 μm. In some embodiments, the conductive pads 118 may be separated from an adjacent metal pad 112 by a distance D2 that is between about 2 μm and about 30 μm. The embodiments described in the present disclosure may allow for a smaller separation distance between conductive pads 118 and adjacent metal pads 112 without increasing the chance of causing processing defects such as shorts. In this manner, the dimensions of the device structure 100 may be reduced without decreasing the yield.

Figure 5:
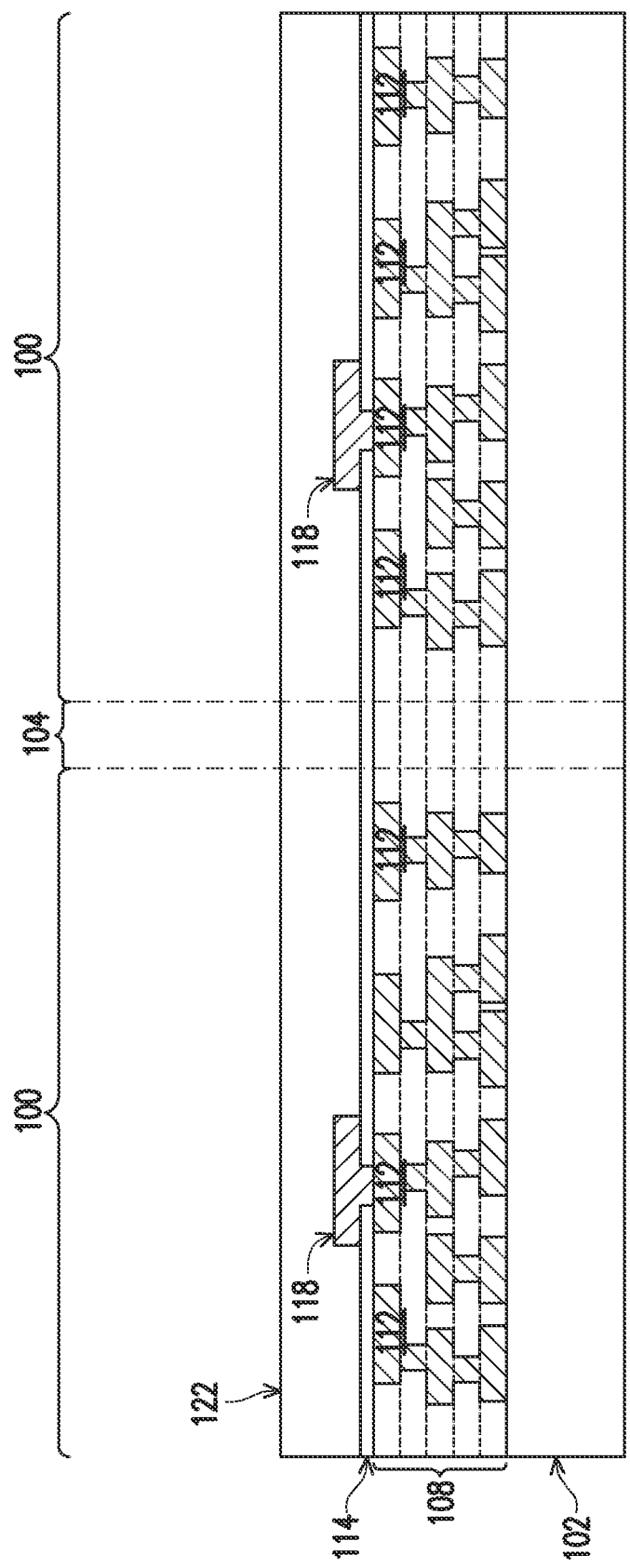

Turning to FIG. 5, a dielectric layer 122 is formed over the passivation layer 114 and the conductive pads 118. The dielectric layer 122 may be formed from one or more layers of one or more dielectric materials, such as silicon oxide, silicon nitride, silicon oxynitride, silicon carbonitride, SiOC, SiOCH, SiCH, the like, or a combination thereof. In some embodiments, the dielectric layer 122 may be formed from phosphosilicate glass (PSG), borosilicate glass (BSG), boron-doped phosphosilicate glass (BPSG), fluorine-doped silicate glass (FSG), tetraethyl orthosilicate (TEOS), the like, or a combination thereof. The dielectric layer 122 may be formed using a deposition process such as CVD, PECVD, PVD, ALD, the like, or a combination thereof. The dielectric layer 122 may be formed to have a thickness greater than a thickness of the conductive pads 118 so that the material of the dielectric layer 122 laterally surrounds the conductive pads 118, and so that the dielectric layer 122 may be planarized (see below) without exposing the conductive pads 118.

Figure 6:
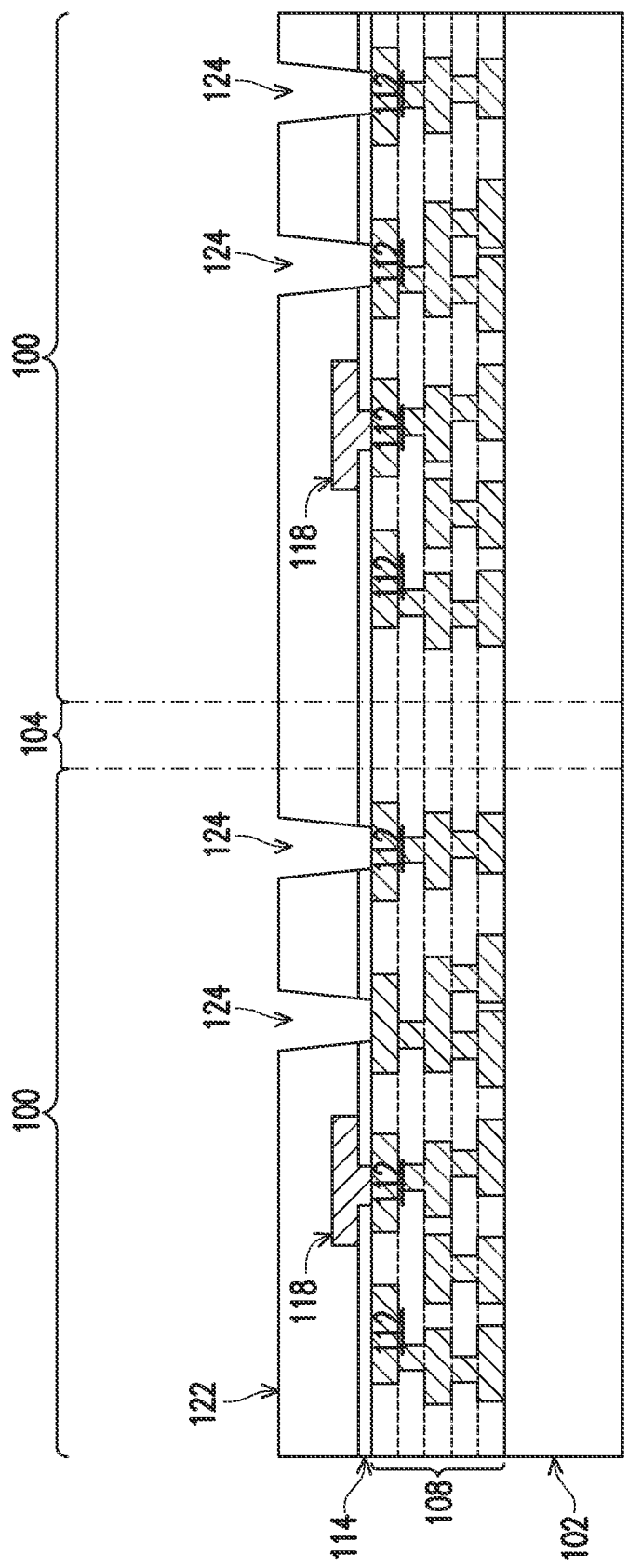

In FIG. 6, openings 124 are formed in the dielectric layer 122, in accordance with some embodiments. The openings 124 expose the metal pads 112 to allow subsequently formed bond pad vias (BPVs) 128 to make electrical connection to the interconnect structure 108 through the metal pads 112. In some embodiments, the openings 124 expose the conductive pads 118, and the BPVs 128 make electrical connection to the interconnect structure 108 through the conductive pads 118 (see e.g., FIGS. 20A-21). The openings 124 may be formed using acceptable photolithography and etching techniques. For example, the photolithography process may include forming a photoresist (not shown) over the dielectric layer 122, patterning the photoresist with openings corresponding to the openings 124, extending the openings 124 through the dielectric layer 122 and the passivation layer 114 to expose the metal pads 112, and then removing the photoresist.

Turning to FIG. 7, bond pad vias (BPVs) 128 are formed in the openings 124, in accordance with some embodiments. The BPVs 128 may have similar dimensions as the openings 124 in which they are formed, and may have a similar shape (e.g., have a tapered profile). In some embodiments, the formation of the BPVs 128 includes first forming a first barrier layer 127 within the openings 124. The first barrier layer 127 may be, for example, a liner, a diffusion barrier layer, an adhesion layer, or the like. The first barrier layer 127 may include one or more layers comprising titanium, titanium nitride, tantalum, tantalum nitride, the like, or combinations thereof. The first barrier layer 127 may be deposited as a blanket layer over the dielectric layer 122 and within the openings 124. The first barrier layer 127 may be formed using a deposition process such as CVD, PECVD, PVD, the like, or combinations thereof.

The formation of the BPVs 128 may include depositing a conductive material over the first barrier layer 127. The conductive material may include cobalt, copper, a copper alloy, titanium, silver, gold, tungsten, aluminum, nickel, the like, or combinations thereof. The conductive material of the BPVs 128 may be formed using a deposition process such as CVD, PECVD, PVD, the like, or combinations thereof. In some embodiments, the conductive material of the BPVs 128 is formed by depositing a seed layer (not shown) over the first barrier layer 127, which may include copper, a copper alloy, titanium, or the like, and then filling the remainder of the openings 124 using, for example, a plating process, an electro-less plating process, or the like.

After forming the conductive material, a planarization process, such as a grinding process, a chemical-mechanical polish (CMP) process, or the like may be performed to remove excess material from a surface of the dielectric layer 122. The remaining first barrier layer 127 and conductive material thus form the BPVs 128. In this manner, the BPVs 128 may be formed using a single damascene process. In some embodiments, some "dummy" BPVs 128 (not shown) may be formed without having electrical connection to the metal pads 112. In some cases, dummy BPVs 128 may reduce uneven loading and improve surface planarity after the planarization step that removes excess material.

The BPVs 128 may have a width W3 between about 1 μm and about 5 μm, although other widths are possible. In some embodiments, the BPVs 128 may have a tapered profile, such as having an upper width W3A that is between about 1 μm and about 5 μm and a lower width W3B that is between about 0.5 μm and about 4 μm. The width W3 of a BPV 128 may be between about 50% and about 95% of the width W1 of its associated metal pad 112 (see FIG. 2). The BPVs 128 may be formed such that the lateral distance D3 between a sidewall of a BPV 128 and the adjacent sidewall of its associated metal pad 112 between about 1 μm and about 5 μm, although other distances are possible. In some cases, by forming the BPVs 128 separately from the bond pads 316 (see FIG. 17 below), the metal pads 112 may be formed having a smaller width W1 that is closer in size to the width W3 of the BPVs 128. This can allow for the lateral separation between features such as conductive pads 118, metal pads 112, BPVs 128, and/or bond pads 316 (see FIG. 17) to be reduced. Additionally, the distance D3 may be reduced, allowing the BPVs 128 to be formed closer to the edges of the metal pads 112.

Turning to FIG. 8, a bond layer 126 is formed over the dielectric layer 122. The bond layer 126 may be formed from one or more layers of one or more dielectric materials, and may comprise a silicon-containing material such as silicon oxide. In some embodiments, the bond layer 126 may comprise one or more layers of other materials such as silicon nitride, silicon oxynitride, silicon carbonitride, SiOC, SiOCH, SiCH, the like, or a combination thereof. The bond layer 126 may be formed using a deposition process such as CVD, PECVD, PVD, ALD, the like, or a combination thereof. In some embodiments, the bond layer 126 comprises a different material than the dielectric layer 122.

In FIG. 9, a singulation process is performed along scribe line regions 104 to separate adjacent device structures 100. The singulation process may include a dicing process, a sawing process, a laser process, the like, or a combination thereof. In some embodiments, singulated device structures 100 that were probed and found to be Known Good Die (KGD), described above in FIG. 4, are used in subsequent process steps to form die structures 300 (see FIG. 15).

Figure 10:
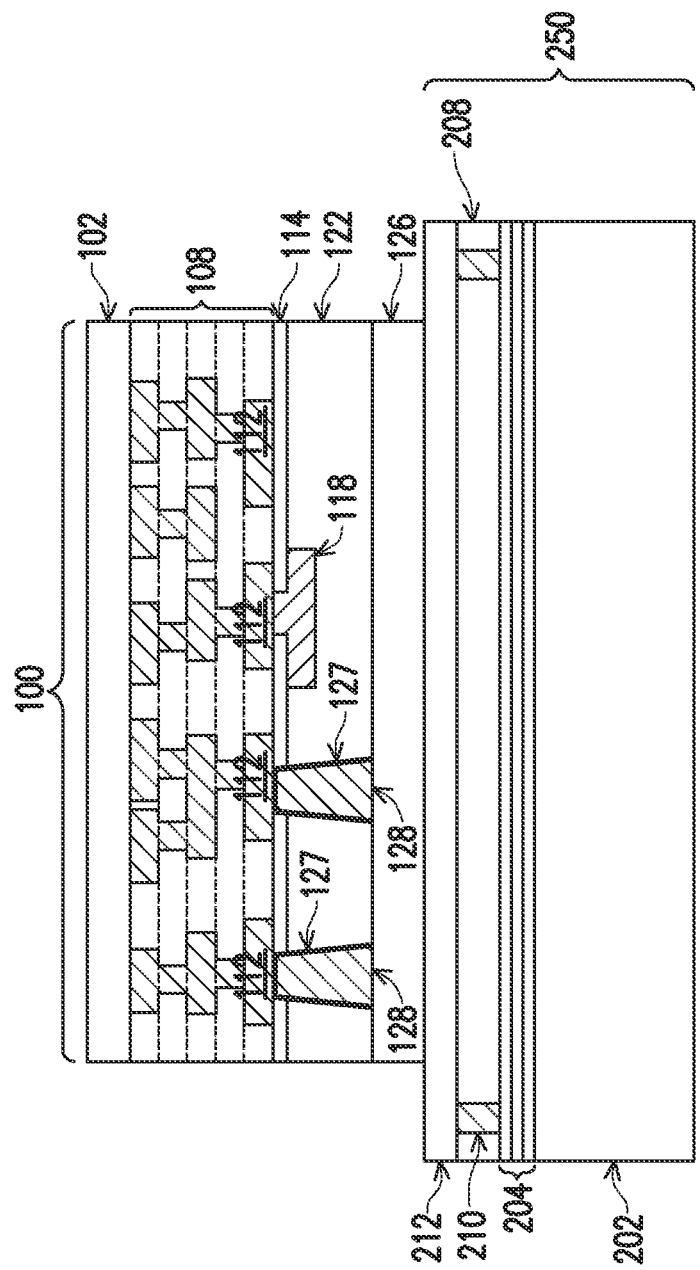
FIGS. 10-17 illustrate cross-sectional views of intermediate steps in a process for forming a die structure, in accordance with some embodiments.

FIGS. 10-17 illustrate cross-sectional views of intermediate stages in the formation of a die structure 300 (see FIG. 17) that incorporates the device structure 100, in accordance with some embodiments. In FIG. 10, the device structure 100 is bonded to a carrier 202, in accordance with some embodiments. The carrier 202 may be a silicon substrate (e.g., a silicon wafer), a glass substrate, an organic substrate (e.g. a panel), or the like. In some embodiments, one or more layers such as oxide layers or etch stop layers may be formed on the carrier 202, which are shown in FIGS. 10-13 as layers 204. In some embodiments, a dielectric layer 208 is formed on the carrier 202, and optional alignment features 210 may be formed within the dielectric layer 208. In some embodiments, the dielectric layer 208 may be formed from silicon oxide, PSG, BSG, BPSG, FSG, silicon nitride, the like, or a combination thereof. The dielectric layer 208 may be formed using a deposition process such as CVD, PECVD, PVD, the like, or a combination thereof. In some embodiments, the dielectric layer 208 is formed of a softer material than the subsequently formed bond layer 212, and may act as a buffer layer for absorbing stress. In accordance with some embodiments, the alignment features 210 are metal features formed in the dielectric layer 208. The alignment features 210 may be used as alignment marks for aligning the subsequent placement (e.g., using a pick-and-place process) and the bonding of device structure 100. The alignment features 210 may be formed, for example, using a damascene process or another suitable process.

A bond layer 212 may then be formed over the dielectric layer 208. The bond layer 212 may be formed from one or more layers of one or more dielectric materials such as silicon oxide or the like. The bond layer 212 may be formed using a deposition process such as CVD, PECVD, PVD, ALD, the like, or a combination thereof. The bond layer 212 may comprise the same material as the bond layer 126 or a different material than the bond layer 126. The combination of the carrier 202, the dielectric layer 208, and the bond layer 212 is referred to herein as the first carrier structure 250.

Still referring to FIG. 10, the device structure 100 is placed on the first carrier structure 250 using, for example, a pick-and-place process. The alignment features 210 may be used during placement to align the device structure 100. The device structure 100 is placed such that the bond layer 126 and the bond layer 212 are in contact. A plasma cleaning process or a wet chemical cleaning process may be performed on the bond layer 126 or the bond layer 212 prior to placement in order to activate the surfaces. After placement, the bond layer 126 of the device structure 100 is bonded to the bond layer 212 using direct bonding (e.g., "fusion bonding" or "dielectric-to-dielectric bonding"), which may, for example, form Si—O—Si bonds between the bond layer 126 and the bond layer 212. In some embodiments, the bond layer 126 and the bond layer 212 may be pressed against each other to facilitate the bonding process. The bonding process may be performed at room temperature (e.g., at a temperature of from about 21° C. to about 25° C.), although higher temperatures may be used. In some embodiments, an anneal is performed after bonding, which may strengthen the bond between the bond layer 126 and the bond layer 212.

Figure 11:
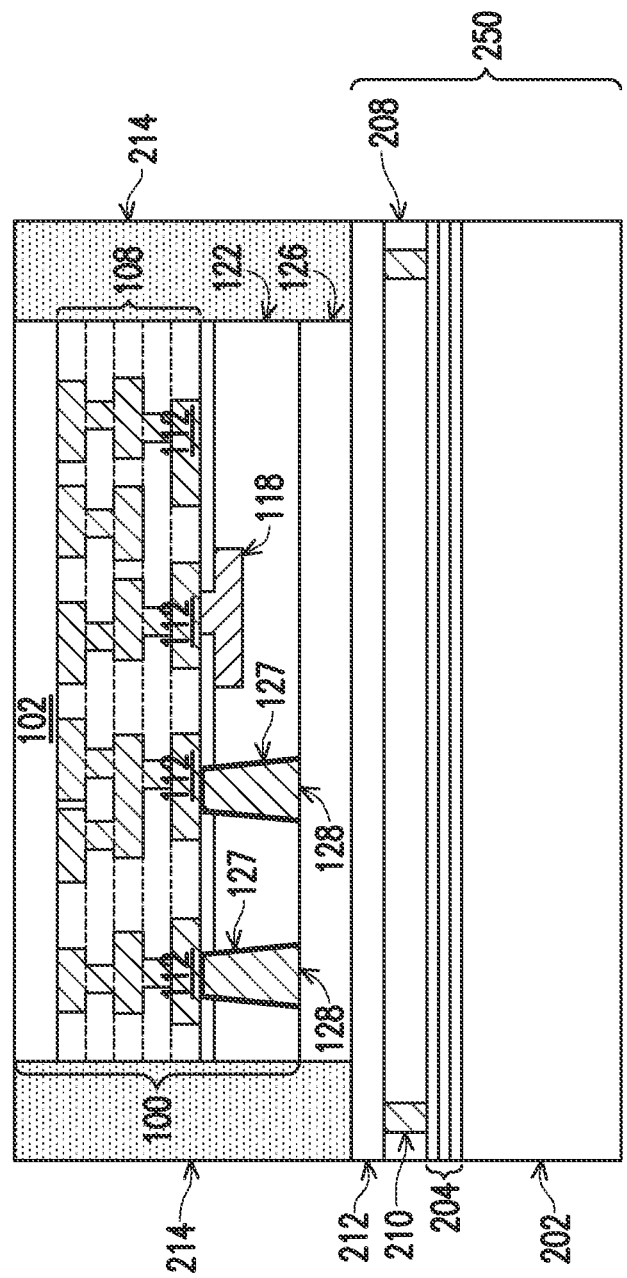

Turning to FIG. 11, dielectric regions 214 (otherwise known as "gap-fill dielectric" regions) are formed surrounding the device structure 100, in accordance with some embodiments. In some embodiments, the dielectric regions 214 may be formed from one or more layers of silicon oxide, PSG, BSG, BPSG, FSG, silicon nitride, the like, or a combination thereof. The dielectric material of the dielectric regions 214 may be formed using a deposition process such as CVD, PECVD, PVD, the like, or a combination thereof. In some embodiments, the dielectric material may be formed by dispensing a flowable dielectric material (e.g., a flowable oxide), and then curing the flowable dielectric material. The flowable dielectric material may be dispensed using a lamination process, a spin-coating process, or the like. After forming the dielectric material, a planarization process (e.g., a CMP or grinding process) may be performed to remove excess dielectric material from over the substrate 102 of the device structure 100, forming the dielectric regions 214. After performing the planarization process, the dielectric regions 214 and the substrate 102 may have level (e.g., coplanar) surfaces. In some embodiments, the planarization process also thins the substrate 102.

Figure 12:
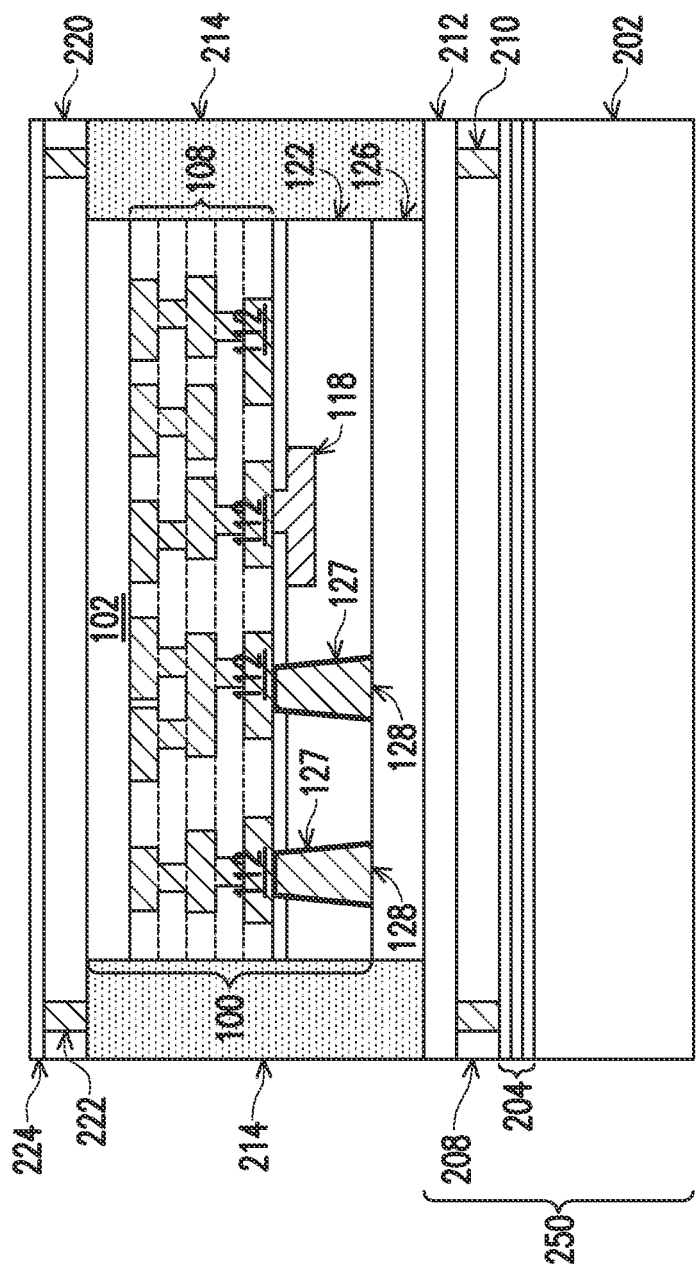

Turning to FIG. 12, a dielectric layer 220 is formed on the dielectric regions 214 and substrate 102. In some embodiments, optional alignment features 222 are formed within the dielectric layer 220. In some embodiments, the dielectric layer 220 may be formed from silicon oxide, PSG, BSG, BPSG, FSG, silicon nitride the like, or a combination thereof. The dielectric layer 220 may be formed using a deposition process such as CVD, PECVD, PVD, the like, or a combination thereof. In some embodiments, the dielectric layer 220 is formed of a softer material than the subsequently formed bond layer 224, and may act as a buffer layer for absorbing stress. In accordance with some embodiments, the alignment features 222 are metal features formed in the dielectric layer 220. The alignment features 222 may be formed, for example, using a damascene process or another suitable process.

A bond layer 224 may then be formed over the dielectric layer 220. The bond layer 224 may be formed from one or more layers of one or more dielectric materials such as silicon oxide or the like. The bond layer 224 may be formed from similar materials or using similar techniques as described above for bond layer 126.

Figure 13:
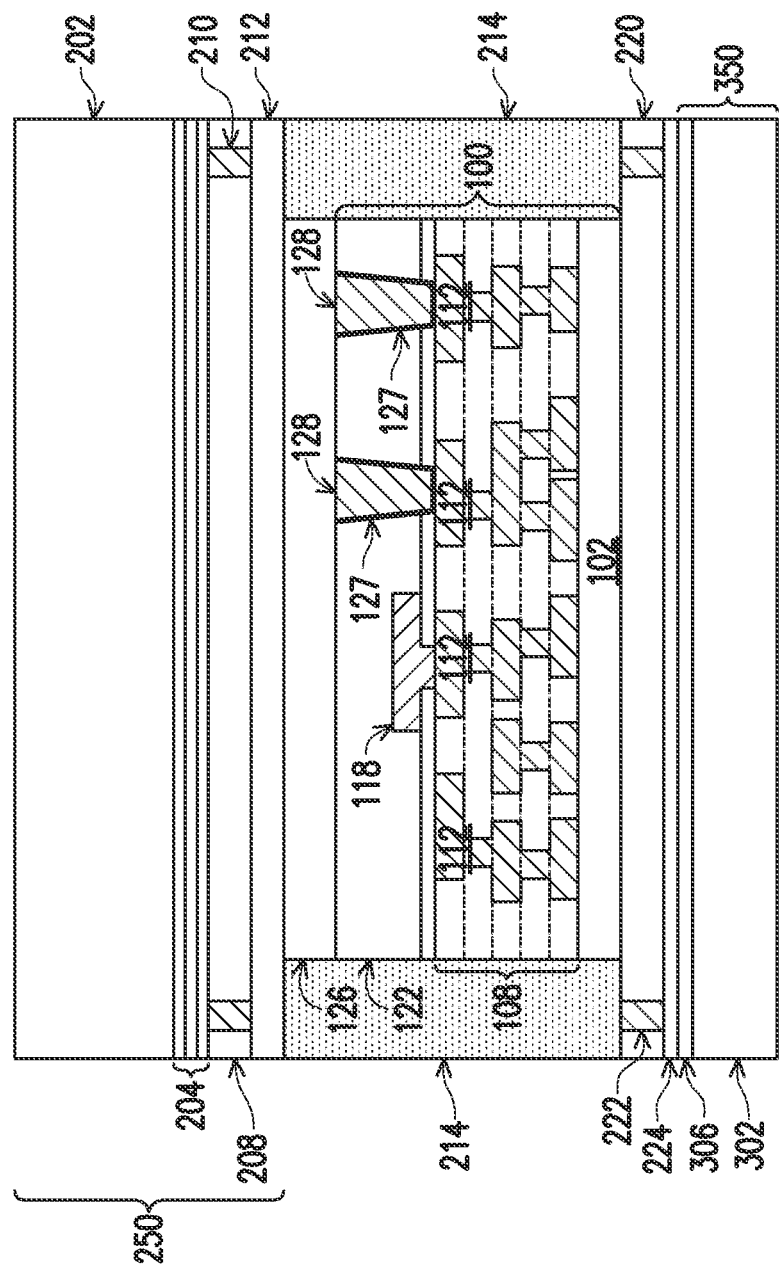

Turning to FIG. 13, the structure is flipped over and bonded to a second carrier structure 350, and then the first carrier structure 250 is removed, in accordance with some embodiments. The second carrier structure 350 may include, for example, a bond layer 306 formed over a carrier 302. The carrier 302 may be a silicon substrate (e.g., a silicon wafer), a glass substrate, an organic substrate (e.g. a panel), or the like. The bond layer 306 may be formed from one or more layers of one or more dielectric materials, and may comprise a silicon-containing material such as silicon oxide, silicon nitride, silicon oxynitride, silicon carbonitride, SiOC, SiOCH, SiCH, the like, or a combination thereof. The bond layer 306 may be formed using a deposition process such as CVD, PECVD, PVD, ALD, the like, or a combination thereof. The bond layer 306 may comprise the same material as the bond layer 224 or a different material than the bond layer 224.

Still referring to FIG. 13, the structure is flipped over, and the bond layer 224 is placed on the bond layer 306 of the second carrier structure 350, in accordance with some embodiments. A plasma cleaning process or a wet chemical cleaning process may be performed on the bond layer 224 or the bond layer 306 prior to placement in order to activate the surfaces. After placement, the bond layer 224 is bonded to the bond layer 306 using direct bonding (e.g., "fusion bonding" or "dielectric-to-dielectric bonding"), which may, for example, form Si—O—Si bonds between the bond layer 224 and the bond layer 306. In some embodiments, the bond layer 224 and the bond layer 306 may be pressed against each other to facilitate the bonding process. The bonding process may be performed at room temperature (e.g., at a temperature of from about 21° C. to about 25° C.), although higher temperatures may be used. In some embodiments, an anneal is performed after bonding, which may strengthen the bond between the bond layer 224 and the bond layer 306.

Figure 14:
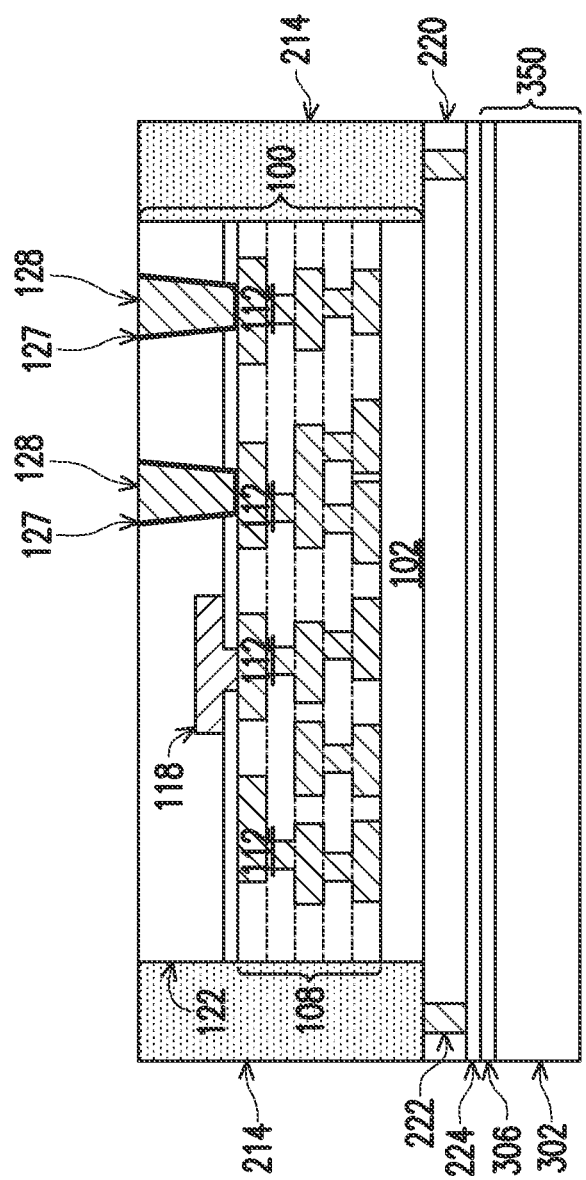

In FIG. 14, the first carrier structure 250 and bond layer 126 are removed, in accordance with some embodiments. In some embodiments, a planarization process (e.g., a CMP or grinding process) may be performed to remove the carrier 202, the dielectric layer 208, the bond layer 212, and the bond layer 126. As shown in FIG. 14, the planarization process may expose the BPVs 128 and the dielectric layer 122. Portions of the dielectric regions 214 are also removed by the planarization process, such that surfaces of the remaining dielectric regions 214 are level with the dielectric layer 122 and BPVs 128. In some embodiments, one or more etching processes (e.g., dry etching processes or wet etching processes) may be used to remove portions of the first carrier structure 250 prior to performing the planarization process. In some embodiments, an etching process may be stopped by a layer such as the bond layer 212, the dielectric layer 208, or an etch stop layer within the carrier 202 (if present).

Figure 15:
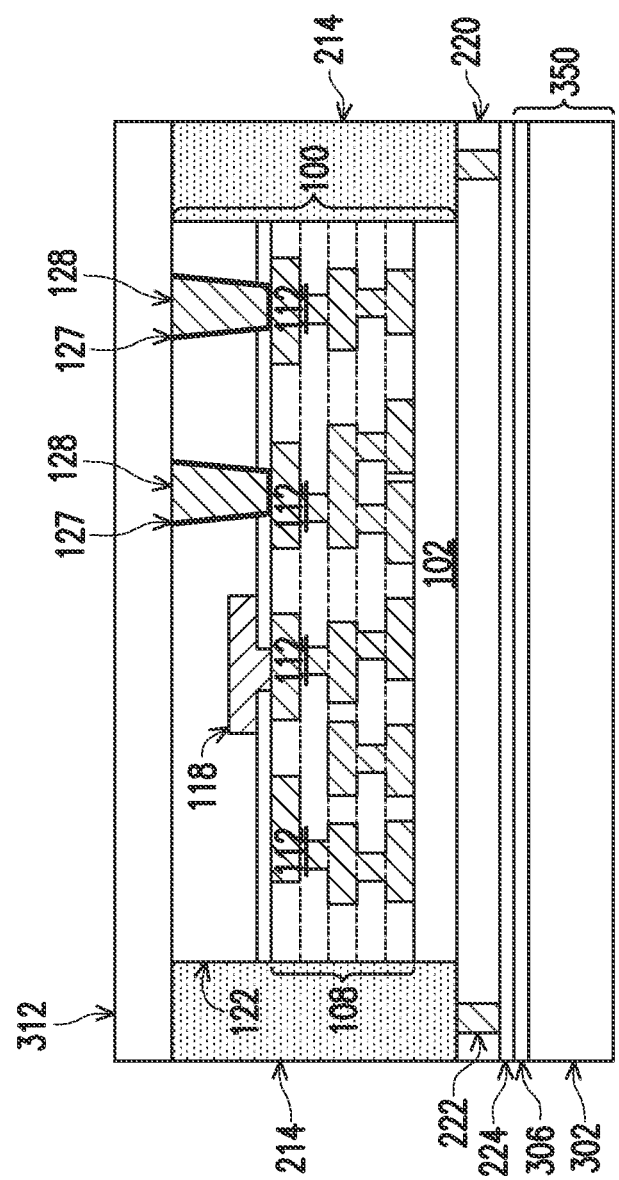

Turning to FIG. 15, a bonding layer 312 is formed over the dielectric regions 214, the dielectric layer 122, and the BPVs 128. The bonding layer 312 may be formed from one or more layers of one or more dielectric materials such as silicon oxide or the like. The bonding layer 312 may be formed from similar materials or using similar techniques as described above for bond layer 126 or bond layer 224. In some embodiments, the bonding layer 312 is formed having a thickness between about 0.2 µm and about 1 µm. The thickness of the bonding layer 312 may determine the thickness of the subsequently formed bond pads 316 (see FIG. 17).

Figure 16:
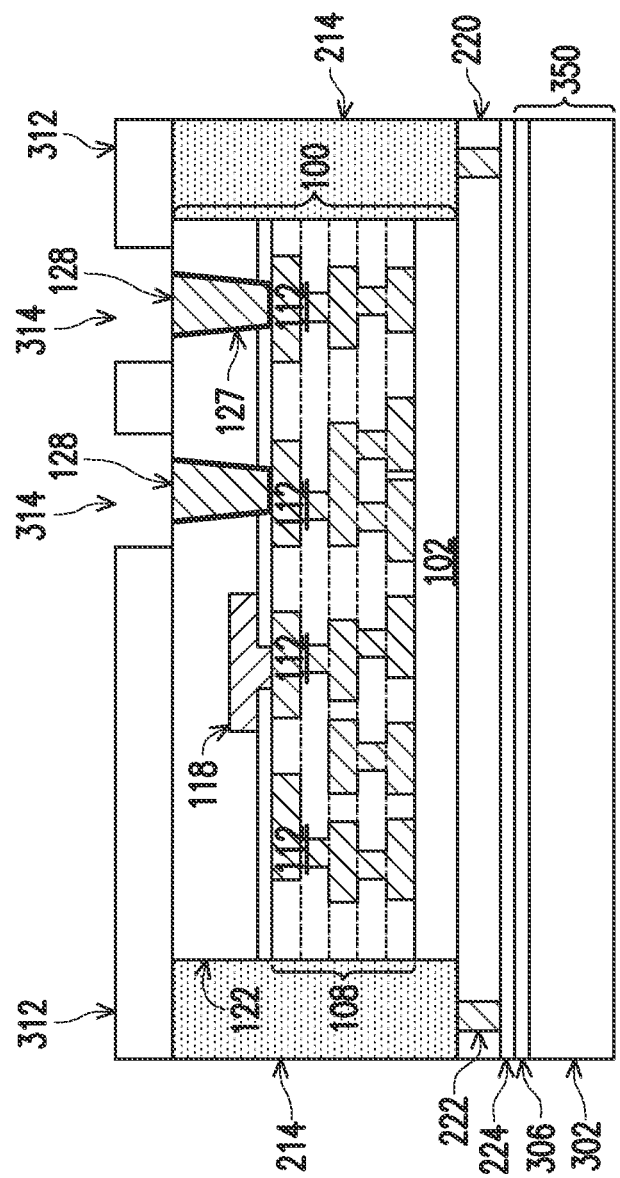

In FIG. 16, openings 314 are formed in the bonding layer 312, in accordance with some embodiments. The openings 314 expose the BPVs 128 to allow subsequently formed bond pads 316 to make electrical connection to the interconnect structure 108 through the BPVs 128. The openings 314 may be formed using acceptable photolithography and etching techniques. For example, the photolithography process may include forming a photoresist (not shown) over the bonding layer 312, patterning the photoresist with openings corresponding to the openings 314, extending the openings 314 through the bonding layer 312 to expose the BPVs 128, and then removing the photoresist.

Figure 17:
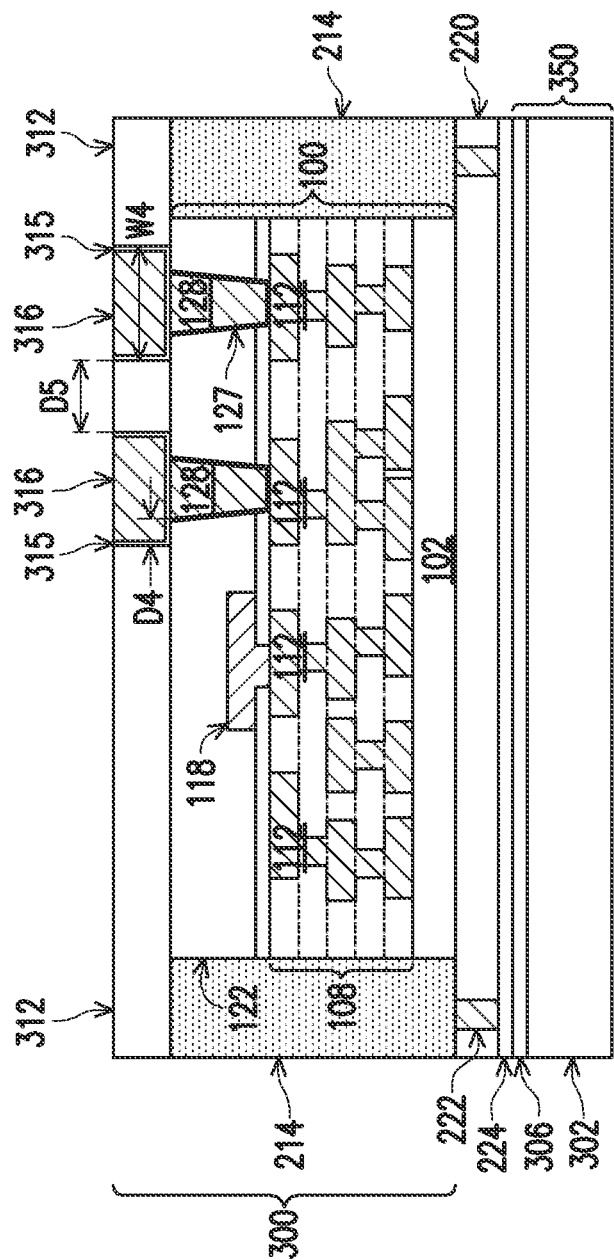

Turning to FIG. 17, bond pads 316 are formed in the openings 314 to form a die structure 300, in accordance with some embodiments. In some embodiments, the formation of the bond pads 316 includes first forming a second barrier layer 315 within the openings 314. The second barrier layer 315 may be, for example, a liner, a diffusion barrier layer, an adhesion layer, or the like. The second barrier layer 315 may include one or more layers comprising titanium, titanium nitride, tantalum, tantalum nitride, the like, or combinations thereof. The second barrier layer 315 may be deposited as a blanket layer over the bonding layer 312 and within the openings 314. The second barrier layer 315 may be formed using a deposition process such as CVD, PECVD, PVD, the like, or combinations thereof. The second barrier layer 315 may be formed from material(s) similar to the first barrier layer 127, in some embodiments. As shown in FIG. 17, because the BPVs 128 are formed in a separate process step prior to formation of the bond pads 316, each second barrier layer 315 extends over the top of a BPV 218, which may include extending over top surfaces of the first barrier layer 127. In this manner, the first barrier layer 127 of a BPVs 128 and the second barrier layer 315 of a bond pads 316 are formed separately, rather than the BPVs 128 and the bond pads 316 sharing a single, continuous barrier layer formed in a single step.

The formation of the bond pads 316 may include depositing a conductive material over the second barrier layer 315. The conductive material may include, for example, copper or a copper alloy. The conductive material may comprise other materials such as titanium, silver, gold, tungsten, aluminum, nickel, cobalt, the like, or combinations thereof. The conductive material of the bond pads 316 may be formed using a deposition process such as CVD, PECVD, PVD, the like, or combinations thereof. In some embodiments, the conductive material of the bond pads 316 is formed by depositing a seed layer (not shown) over the second barrier layer 315, which may include copper, a copper alloy, titanium, or the like, and then filling the remainder of the openings 314 using, for example, a plating process, an electro-less plating process, or the like. The bond pads 316 may be formed from material(s) similar to the BPVs 128, in some embodiments.

After forming the conductive material, a planarization process, such as a grinding process, a chemical-mechanical polish (CMP) process, or the like may be performed to remove excess material from a surface of the bonding layer 312. The remaining second barrier layer 315 and conductive material thus form the bond pads 316. In this manner, the bond pads 316 may be formed using a single damascene process. In some embodiments, some "dummy" bond pads 316 (not shown) may be formed without having electrical connection to the BPVs 128 and/or the metal pads 112. In some cases, dummy bond pads 316 may reduce uneven loading and improve surface planarity after the planarization step that removes excess material.

In some embodiments, the bond pads 316 may have a width W4 between about 0.2 µm and about 5 µm, although other widths are possible. In some embodiments, the width W4 of a bond pad 316 may be between about 120% and about 200% of the width W3 of its associated BPV 128 (see FIG. 7). In some embodiments, the bond pads 316 may be formed such that the lateral distance D4 between a sidewall of a bond pad 316 and the adjacent sidewall of its associated BPV 128 between about 0.5 µm and about 2 µm, although other distances are possible. In some embodiments, the lateral separation between adjacent bond pads 316 may be a distance D5 that is between about 2 µm and about 7 µm. In some cases, by forming the BPVs 128 separately from the bond pads 316 as described herein, the bond pads 316 may be formed having a smaller separation distance D5. In some cases, by forming the BPVs 128 in a separate process step than the bond pads 316, the lateral separation (e.g., pitch) between features such as conductive pads 118, metal pads 112, BPVs 128, and/or bond pads 316 and the sizes of such features can be reduced without increasing the risk of electrical shorts or other process defects.

Figure 18A:
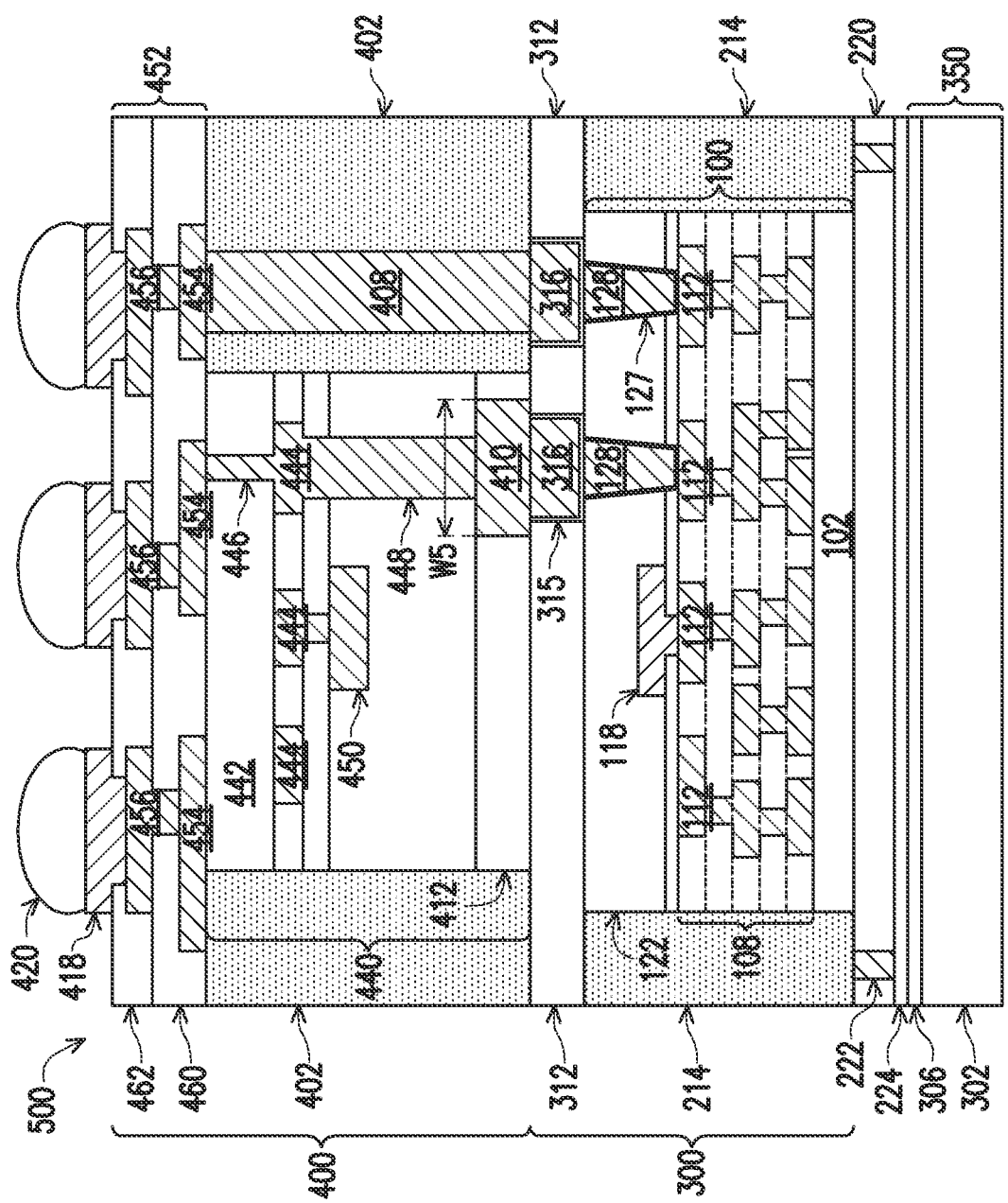
FIGS. 18A, 18B, 19A, 19B, 20A, 20B, and 21 illustrate cross-sectional views of packages having die structures, in accordance with some embodiments.
Figure 18B:
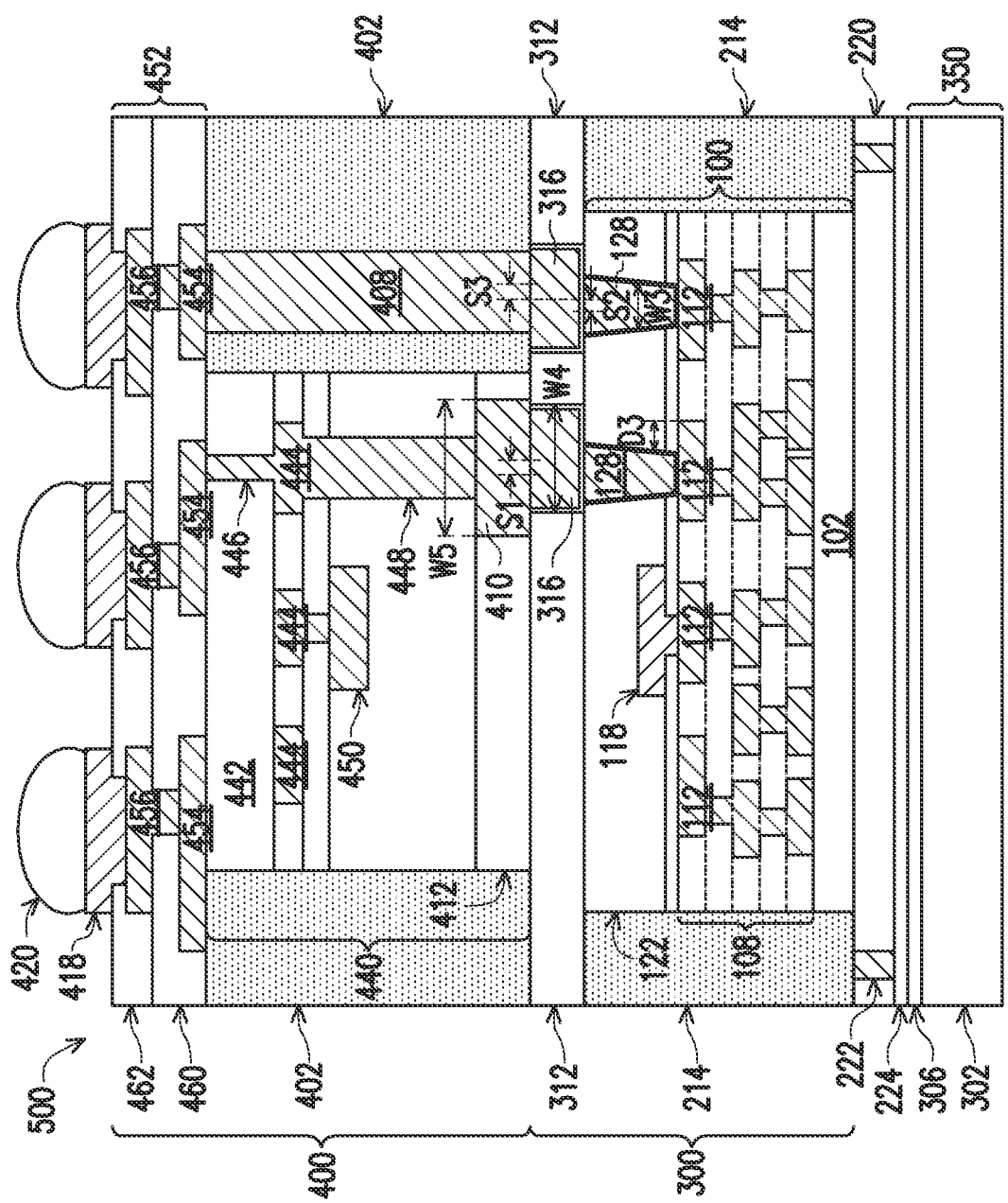

Turning to FIGS. 18A-B, a package 500 is shown comprising the first die structure 300 and a second die structure 400 that are bonded together, in accordance with some embodiments. FIG. 18B shows a package 500 similar to that shown for FIG. 18A, but for illustrative purposes some features in FIG. 18B are shown with a greater alignment offset than in FIG. 18A. The first die structure 300 of the package 500 may be similar to the die structure 300 described for FIG. 17. In some embodiments, the second die structure 400 comprises dielectric regions 402 (otherwise known as "gap-fill dielectric" regions), a device structure 440, a bonding layer 412, and one or more bond pads 410. The second die structure 400 shown in FIGS. 18A-B is an example, and the second die structure 400 or components thereof (e.g., the device structure 440) may be other structures or other types of structures than shown without deviating from the scope of the present disclosure.

The device structure 440 may be similar to the device structure 100 described previously. For example, the device structure 440 may include a substrate 442 similar to the substrate 102, which may include integrated circuit devices formed thereon. In some embodiments, through substrate vias (TSVs) 446 may extend through the substrate 442. The TSVs 446 may be formed by, for example, forming openings extending through the substrate 442 using a suitable photolithography and etching process. The openings may then be filled by a conductive material such as copper or the like, which may be formed using a suitable process such as a plating process. In some embodiments, the device structure 440 includes metal pads 444 or conductive pads 450, which may be similar to the metal pads 112 or the conductive pads 118 of the device structure 100, respectively.

The dielectric regions 402 may be similar to the dielectric regions 214 described previously, such as being formed from silicon oxide or the like. The bonding layer 412 may be formed from one or more layers of one or more dielectric materials such as silicon oxide or the like. The bonding layer 412 may be formed from similar materials or using similar techniques as described above for bond layer 126, bond layer 224, or bonding layer 312. The bond pads 410 may be formed from a conductive material such as copper, a copper alloy, or the like. The bond pads 410 may also include a barrier layer (not shown). The bond pads 410 may be formed from similar material(s) or using similar techniques as described above for the bond pads 316, in some embodiments.

In some embodiments, the bond pads 410 may have a width W5 between about 1 µm and about 5 µm, although other widths are possible. In some embodiments, the width W5 of a bond pad 410 may be between about 95% and about 150% of the width W4 of its associated bond pad 316. In this manner, the width W5 of the bond pads 410 may be larger than the width W4 of the bond pads 316. After bonding the bond pads 410 to the bond pads 316, the bond pads 410 may laterally extend beyond the bond pads 316, as shown in FIG. 18. FIG. 18A shows bond pads 410 approximately centered on bond pads 316, but in other cases, some lateral misalignment between a bond pad 410 and a bond pad 316 may be present. A misalignment may be due to, for example, pick-and-place overlay shift during placement of the second die structure 400 on the first die structure 300. For example, in FIG. 18B, a bond pad 410 is shown as misaligned to a bond pad 316 by a distance S1. The distance S1 corresponds to the lateral offset between the center of the bond pad 410 (e.g., at half of the width W5) and the center of the bond pad 316 (e.g., at half of the width W4). In some cases, forming bond pads 410 that are wider than bond pads 316 can increase the chance that the entirety of the top surfaces of the bond pads 316 are bonded to the bond pads 410 if any misalignment between the first die structure 300 and the second die structure 400 is present. In some cases, the maximum misalignment distance (e.g., S1) for which the entire surface of a bond pad 316 remains bonded is given by the difference between the width W5 of the bond pad 410 and the width W4 of the bond pad 316. Bonding the entire top surfaces of the bond pads 316 can reduce contact resistance between the bond pads 316 and the bond pads 410, and thus can improve electrical performance of the package 500. In this manner, undesirable effects due to misalignment can be reduced by forming bond pads 410 having a larger width than that of the bond pads 316.

Other misalignments are possible. For example, FIG. 18A shows bond pads 316 approximately centered on BPVs 128, but in other cases, some lateral misalignment between a bond pad 316 and a BPV 128 may be present. For example, in FIG. 18B, a bond pad 316 is shown as misaligned to a BPV 128 by a distance S2. The distance S2 corresponds to the lateral offset between the center of the bond pad 316 (e.g., at half of the width W4) and the center of the BPV 128 (e.g., at half of the width W3). In some cases, forming bond pads 316 that are wider than the BPVs 128 can increase the chance that the entirety of the top surfaces of the BPVs 128 are covered by the overlying bond pads 316 if any misalignment between bond pads 316 and BPVs 128 is present. In some cases, the maximum misalignment distance (e.g., S2) for which the entire top surface of a BPV 128 remains covered by an overlying bond pad 316 is given by the difference between the width W4 of the bond pad 316 and the width W3 of the BPV 128. Covering the entire top surfaces of the BPVs 128 can reduce contact resistance between the bond pads 316 and the BPVs 128, and thus can improve electrical performance of the package 500. In this manner, undesirable effects due to misalignment can be reduced by forming bond pads 316 having a larger width than that of the BPVs 128.

The second die structure 400 may also include a redistribution structure 452 including dielectric layers 460 and 462 and metallization patterns 454 and 456. The redistribution structure 452 may be designed to connect the various features, such as the device structure 440 and any through vias 408 (described below) to form functional circuitry. The metallization patterns may also be referred to as redistribution layers or redistribution lines. More or fewer dielectric layers and metallization patterns may be formed in the redistribution structure 452 than shown. If fewer dielectric layers and metallization patterns are to be formed, steps and process discussed below may be omitted. If more dielectric layers and metallization patterns are to be formed, steps and processes discussed below may be repeated.

As an example to form the redistribution structure 452, the metallization pattern 454 may first be formed. To form the metallization pattern 454, a seed layer is formed over device structure 400 and the dielectric regions 402. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 454. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 454. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 460 then deposited on the metallization pattern 454, the device 440, and the dielectric regions 402. In some embodiments, the dielectric layer 460 is formed of a photo-sensitive material such as PBO, polyimide, BCB, or the like, which may be patterned using a lithography mask. The dielectric layer 460 may be formed by spin coating, lamination, CVD, the like, or a combination thereof. The dielectric layer 460 is then patterned. The patterning forms openings exposing portions of the metallization pattern 454. The patterning may be by an acceptable process, such as by exposing the dielectric layer 124 to light when the dielectric layer 460 is a photo-sensitive material or by etching using, for example, an anisotropic etch. If the dielectric layer 460 is a photo-sensitive material, the dielectric layer 460 can be developed after the exposure.

The metallization pattern 456 is then formed on the patterned dielectric layer 460 and extending into the openings in the dielectric layer 460 to contact the metallization pattern 454. The metallization pattern 456 may be formed in a manner similar to the metallization pattern 454, and may be formed of a similar material as the metallization pattern 454. The dielectric layer 462 may be formed on the metallization pattern 456 and the dielectric layer 460. The dielectric layer 462 may be formed in a manner similar to the dielectric layer 460, and may be formed of a similar material as the dielectric layer 460. The redistribution structure 452 may be formed using other materials or techniques than described in this example.

In some embodiments, the second die structure 400 includes one or more through vias 408 that extends partially or completely through the second die structure 400 to connect the redistribution structure 452 or other features on opposite sides of the second die structure 400. A second die structure 400 may include zero, one, two, or more than two through vias 408, in some embodiments. The second die structure 400 shown in FIG. 18 also includes underbump metallizations (UBMs) 418 and external connectors 420 formed on the redistribution structure 452, in accordance with some embodiments. The UBMs 418 provide electrical connection to conductive features within the second die structure 400, and the external connectors 420 (e.g., solder balls, bumps, or the like) are formed on the UBMs 418. In some embodiments, the UBMs 418 are not formed prior to forming the external connectors 420, and in some embodiments, the external connectors 420 are not formed on the second die structure 400.

The second die structure 400 shown is an illustrative example, and it will be appreciated that all suitable die, chips, devices, or the like are considered within the scope of this disclosure. In some embodiments, the second die structure 400 may be formed in a manner similar to first die structure 300. For example, the second die structure 400 may include BPVs (not individually labeled) formed in a first process step, and the bond pads 410 may be formed over the BPVs in a separate process step, similar to as described above for FIG. 7 and FIG. 17.

In some embodiments, the second die structure 400 is bonded to the first die structure 300 to form package 500 using, e.g., direct bonding or hybrid bonding. Before performing the bonding, a surface treatment may be performed on the second die structure 400 or the first die structure 300 in order to activate the surfaces. In some embodiments, the surface treatment includes a plasma treatment. The plasma treatment may be performed in a vacuum environment (e.g., a vacuum chamber, not shown). The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). The plasma treatment may also be performed using pure or substantially pure $H_2$, Ar, or $N_2$ as the process gas, which treats the surfaces of the bond pads 316/410 and the bonding layers 312/412. The second die structure 400 or the first die structure 300 may be treated with the same surface treatment process, or with different surface treatment processes, or not treated. In some embodiments, the second die structure 400 or the first die structure 300 may be cleaned after the surface treatment.

Cleaning may include performing e.g., a chemical cleaning and a de-ionized water cleaning/rinse.

Next, a pre-bonding process may be performed with the second die structure 400 and the first die structure 300. The second die structure 400 is placed on the first die structure 300 using, for example, a pick-and-place process. The alignment features 222 may be used during placement to align the second die structure 400. The second die structure 400 and the first die structure 300 are aligned such that the bonding pads 410 and/or the through vias 408 of the second die structure 400 are aligned to the bonding pads 316 of the first die structure 300. After the alignment, the second die structure 400 and the first die structure 300 may be pressed against each other. The pressing force may be less than about 5 Newtons per die in some embodiments, although a greater or smaller force may also be used. The pre-bonding process may be performed at room temperature (e.g., at a temperature of from about 21° C. to about 25° C.), although higher temperatures may be used. The pre-bonding time may be shorter than about 1 minute, in some embodiments.

After the pre-bonding, the bonding layer 412 of the second die structure 400 and the bonding layer 312 of the first die structure 300 are bonded to each other, forming package 500. The bond between the bonding layers 312/412 may be strengthened in a subsequent annealing step. The package 500 may be annealed at a temperature of from about 300° C. to about 400° C. and for a period of time between about 1 hour and about 2 hours, for example. During the annealing, metals in the bond pads 316 and 410 may diffuse such that metal-to-metal bonds are also formed. Bonds between the bond pads 316 and corresponding through vias 408 may be formed similarly. Hence, the resulting bonds between the first die structure 300 and the second die structure 400 may be hybrid bonds. In some embodiments, after the annealing, no material interface is present between the bond pads 316 and the corresponding bond pads 410 or through vias 408. In some embodiments, a singulation process may be performed on the package 500 after bonding.

FIG. 18A shows a through via 408 approximately centered on a bond pad 316, but in other cases, some lateral misalignment between a through via 408 and a bond pad 316 may be present. For example, in FIG. 18B, a through via 408 is shown as misaligned to a bond pad 316 by a distance S3. The distance S3 corresponds to the lateral offset between the center of the through via 408 and the center of the bond pad 316 (e.g., at half of the width W4). In some cases, forming bond pads 316 that are wider than the through vias 408 can increase the chance that the entirety of the surfaces of the through vias 408 are bonded to the corresponding bond pads 316 if any misalignment between bond pads 316 and through vias 408 is present. In some cases, the maximum misalignment distance (e.g., S3) for which the entire surface of a through via 408 remains bonded to a corresponding bond pad 316 is given by the difference between the width W4 of the bond pad 316 and the width of the through via 408.

FIGS. 19A-B, 20A-B, and 21 illustrate packages 510, 520, and 530, each including a first die structure 300 bonded to a second die structure 400, in accordance with some embodiments. For each of the packages 510, 520, and 530, the first die structure 300 and the second die structure 400 may be similar to the first die structure 300 and the second die structure 400 as described for FIGS. 18A-B, and the first die and the second die may be bonded in a similar manner as described for FIGS. 18A-B. All such variations of forming packages are contemplated within the scope of this disclosure.

Figure 19A:
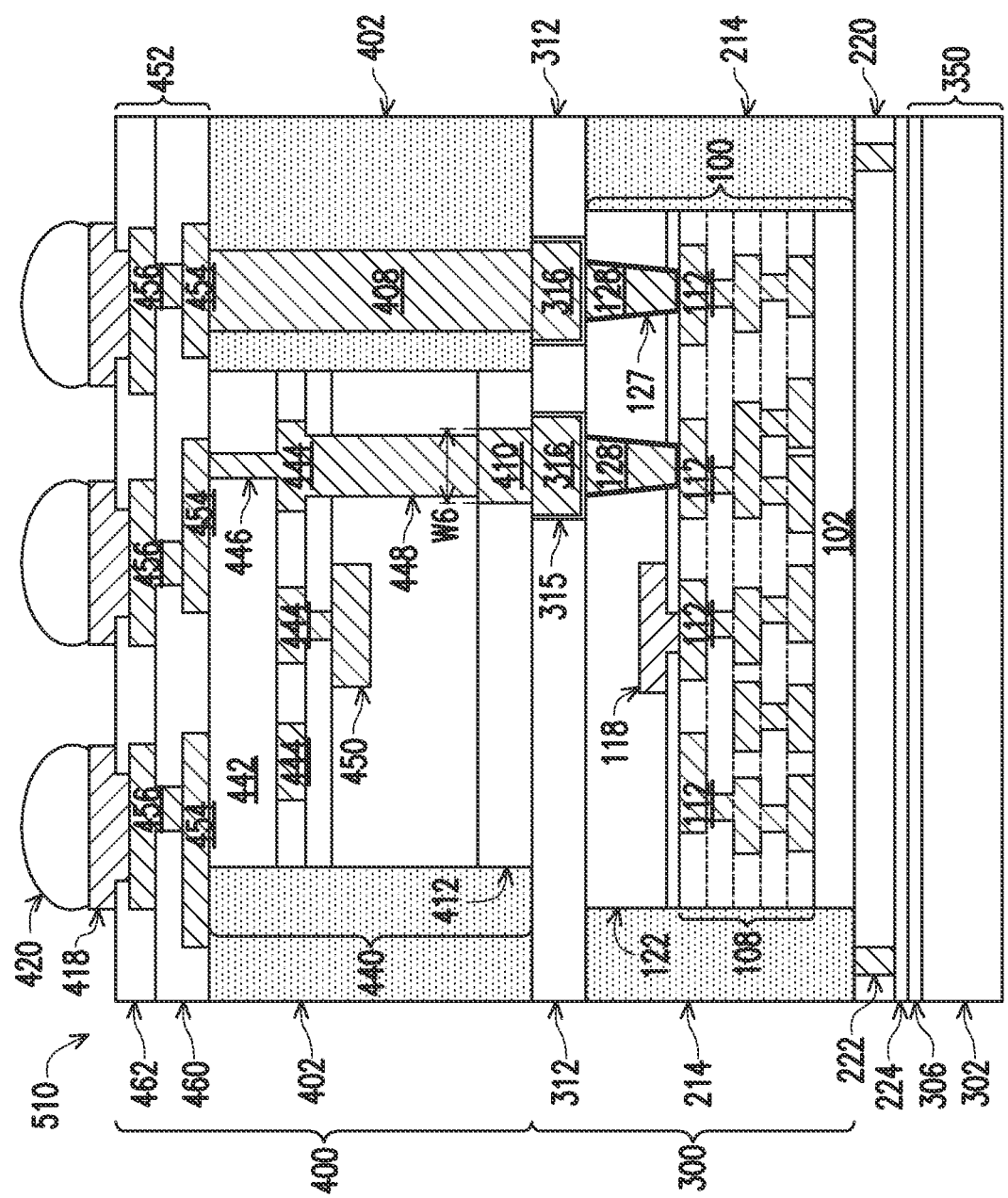
Figure 19B:
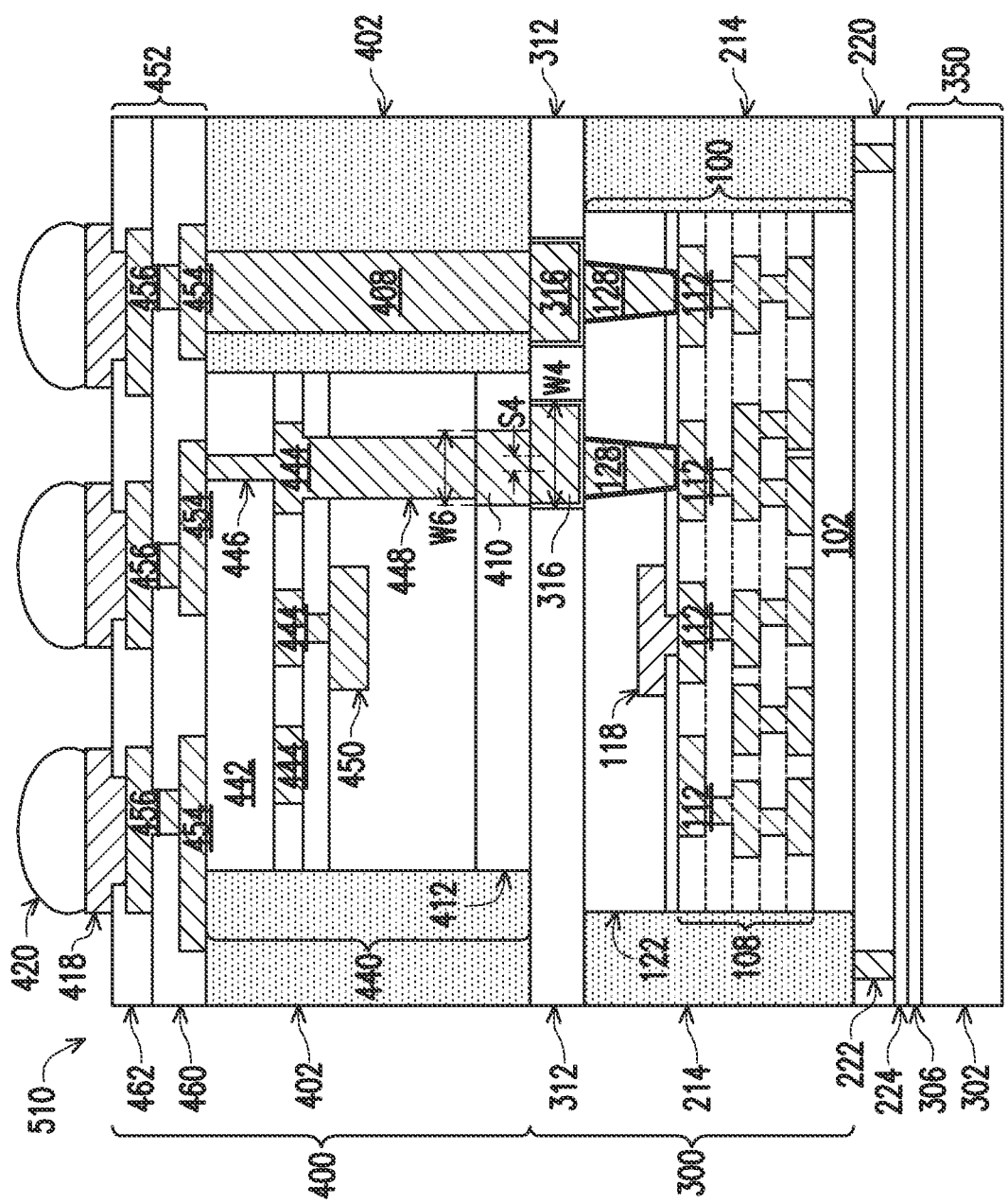

Turning first to FIG. 19A, the package 510 is similar to package 500 shown in FIG. 18A, except that the bond pads 410 of the second die structure 400 have a width W6 that is smaller than the width W4 (see FIG. 17) of the bond pads 316 of the first die structure 300. FIG. 19B shows a package 510 similar to that shown for FIG. 19A, but for illustrative purposes some features in FIG. 19B are shown with a greater alignment offset than in FIG. 19A. In some embodiments, the bond pads 410 may have a width W6 between about 1.5 µm and about 5 µm, although other widths are possible. In some embodiments, the width W6 of a bond pad 410 may be between about 40% and about 90% of the width W4 of its associated bond pad 316. In this manner, the width W6 of the bond pads 410 may be smaller than the width W4 of the bond pads 316. After bonding the bond pads 410 to the bond pads 316, the bond pads 316 may laterally extend beyond the bond pads 410, as shown in FIG. 19A.

FIG. 19A shows a bond pad 410 approximately centered on a bond pad 316, but in other cases, some lateral misalignment between a bond pad 410 and a bond pad 316 may be present. For example, in FIG. 19B, a bond pad 410 is shown as misaligned to a bond pad 316 by a distance S4. The distance S4 corresponds to the lateral offset between the center of the bond pad 410 (e.g., at half of the width W6) and the center of the bond pad 316 (e.g., at half of the width W4). In some cases, forming bond pads 410 that have a smaller width than bond pads 316 can increase the chance that the entirety of the top surfaces of the bond pads 410 are bonded to the bond pads 316 if any misalignment between the first die structure 300 and the second die structure 400 is present. In some cases, the maximum misalignment distance (e.g., S4) for which the entire surface of a bond pad 410 remains bonded is given by the difference between the width W6 of the bond pad 410 and the width W4 of the bond pad 316. Bonding the entire bonding surfaces of the bond pads 410 can reduce contact resistance between the bond pads 316 and the bond pads 410, and thus can improve electrical performance of the package 510. In this manner, undesirable effects due to misalignment can be reduced by forming bond pads 410 having a smaller width than that of the bond pads 316.

Figure 20A:
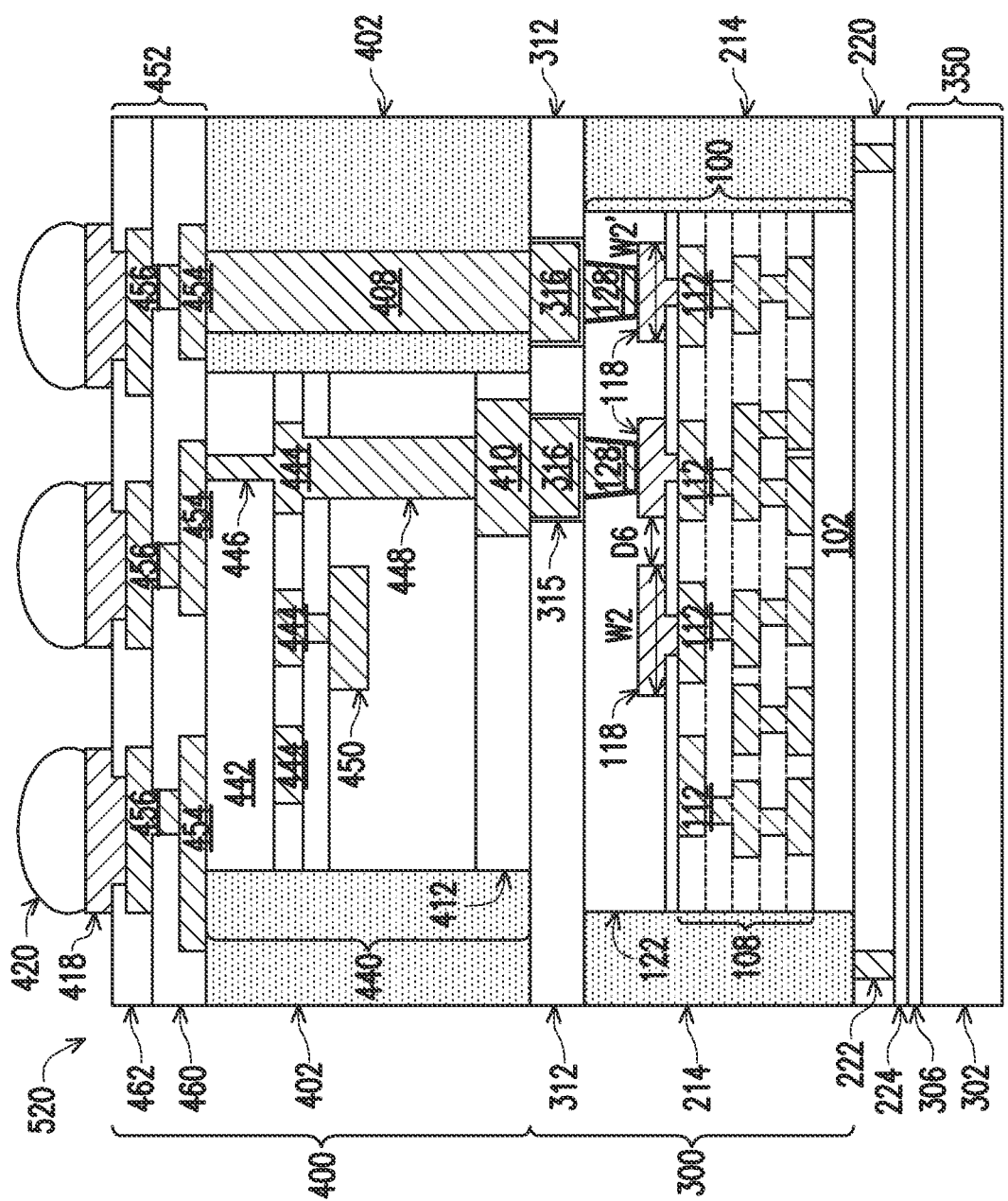
Figure 20B:
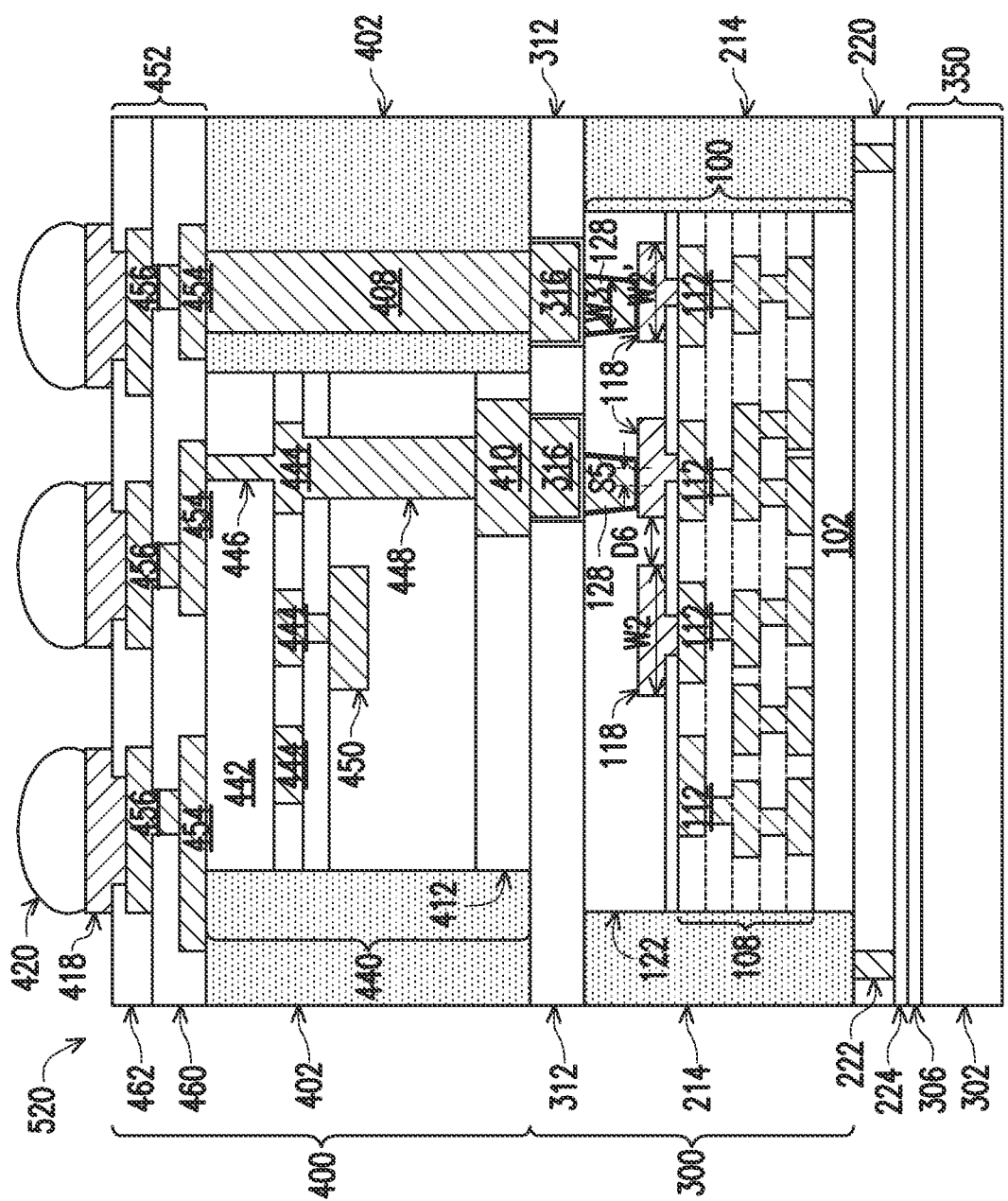
Figure 21:
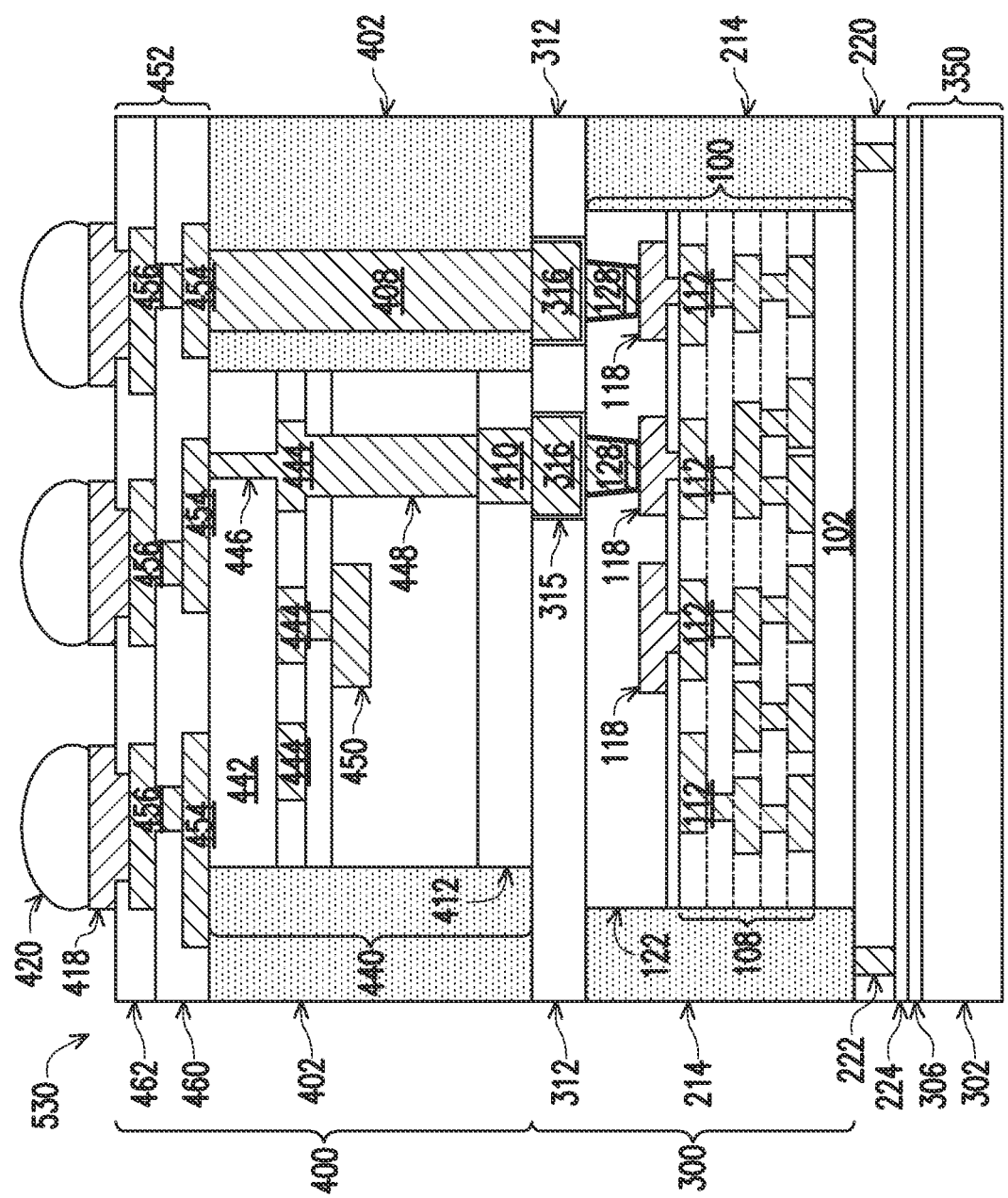

Turning next to FIGS. 20A-B and 21, the packages 520 and 530 are similar to package 500 shown in FIGS. 18A-B, except that the BPVs 128 contact the conductive pads 118 and make electrical connection to the interconnect structure 108 through the conductive pads 118. FIGS. 20A-B show a package 520 in which the bond pads 410 of the second die structure 400 have a width that is larger than the bond pads 316 of the first die structure 300, similar to package 500 shown in FIGS. 18A-B. FIG. 20B shows a package 520 similar to that shown for FIG. 20A, but for illustrative purposes some features in FIG. 20B are shown with a greater alignment offset than in FIG. 20A. FIG. 21 shows a package 530 in which the bond pads 410 of the second die structure 400 have a width that is smaller than the bond pads 316 of the first die structure 300, similar to package 510 shown in FIG. 19. Misalignment similar to that described for FIGS. 18A-B, 19A-B, and 20A may also be present for the package 530 described for FIG. 21, but is not shown in a separate figure.

The conductive pads 118 that contact the BPVs 128 may be formed in a similar manner as the conductive pad 118 shown above for FIGS. 3-4. For example, the passivation layer 114 may be patterned to expose the metal pads 112, and then the conductive pads 118 formed over the metal pads 112. The BPVs 128 may be formed in a similar manner as the BPVs 128 shown in FIGS. 6-7. For example, openings 124 may be formed in the dielectric layer 122, except that the openings expose the conductive pads 118 instead of the metal pads 112. The first barrier layer 127 and the conductive material of the BPVs 128 may then be formed in the openings 124 as described for FIG. 7. As shown in FIGS. 20A-B and 21, some conductive pads 118 may not be connected to a BPV 128. In some embodiments, the lateral separation between adjacent conductive pads 118 may be a distance D6 that is between about 2 μm and about 100 μm.

In some cases, by forming the BPVs 128 separately from the bond pads 316 as described herein, the conductive pads 118 may be formed having a smaller size and/or separation distance D6. In some cases, by forming the BPVs 128 to contact the conductive pads 118, the BPVs 128 may be formed having a smaller size and smaller separation distance. For example, the shallower depth of the openings 124 to contact the conductive pads 118 may allow for more accurate photolithographic patterning. In some embodiments, conductive pads 118 that are formed to be contacted by BPVs 128 may be formed having a smaller width than conductive pads 118 that are not contacted by BPVs 128. For example, the conductive pads 118 that are not probed may be formed having a smaller width. In some embodiments, the conductive pads 118 that are formed to be contacted by BPVs 128 may have a width W2' that is between about 1% and about 90% smaller than the width W2 of the other conductive pads 118.

FIG. 20A shows a BPV 128 approximately centered on a conductive pad 118, but in other cases, some lateral misalignment between a BPV 128 and a conductive pad 118 may be present. For example, in FIG. 20B, a BPV 128 is shown as misaligned to a conductive pad 118 by a distance S5. The distance S5 corresponds to the lateral offset between the center of the BPV 128 (e.g., at half of the width W3) and the center of the conductive pad 118 (e.g., at half of the width W2'). In some cases, by forming the BPVs 128 in a separate process step than the bond pads 316 allows for BPVs 128 to be formed having a smaller width (e.g., W3). Forming BPVs 128 that have a smaller width (e.g., a smaller width than corresponding conductive pads 118) can increase the chance that the entirety of the surfaces of the BPVs 128 are bonded to the conductive pads 118 if any misalignment is present. In some cases, the maximum misalignment distance (e.g., S5) for which the entire surface of a BPV 128 remains bonded is given by the difference between the width W3 of the BPV 128 and the width W2' of the corresponding conductive pas 118. Bonding the entire bonding surfaces of the BPVs 128 can reduce contact resistance between the BPVs 128 and the conductive pads 118, and thus can improve electrical performance of the package 520. In this manner, the size or pitch of some conductive features of a bonded package can be reduced without increasing the risk of undesirable effects due to misalignment or other process defects.

Figure 22:
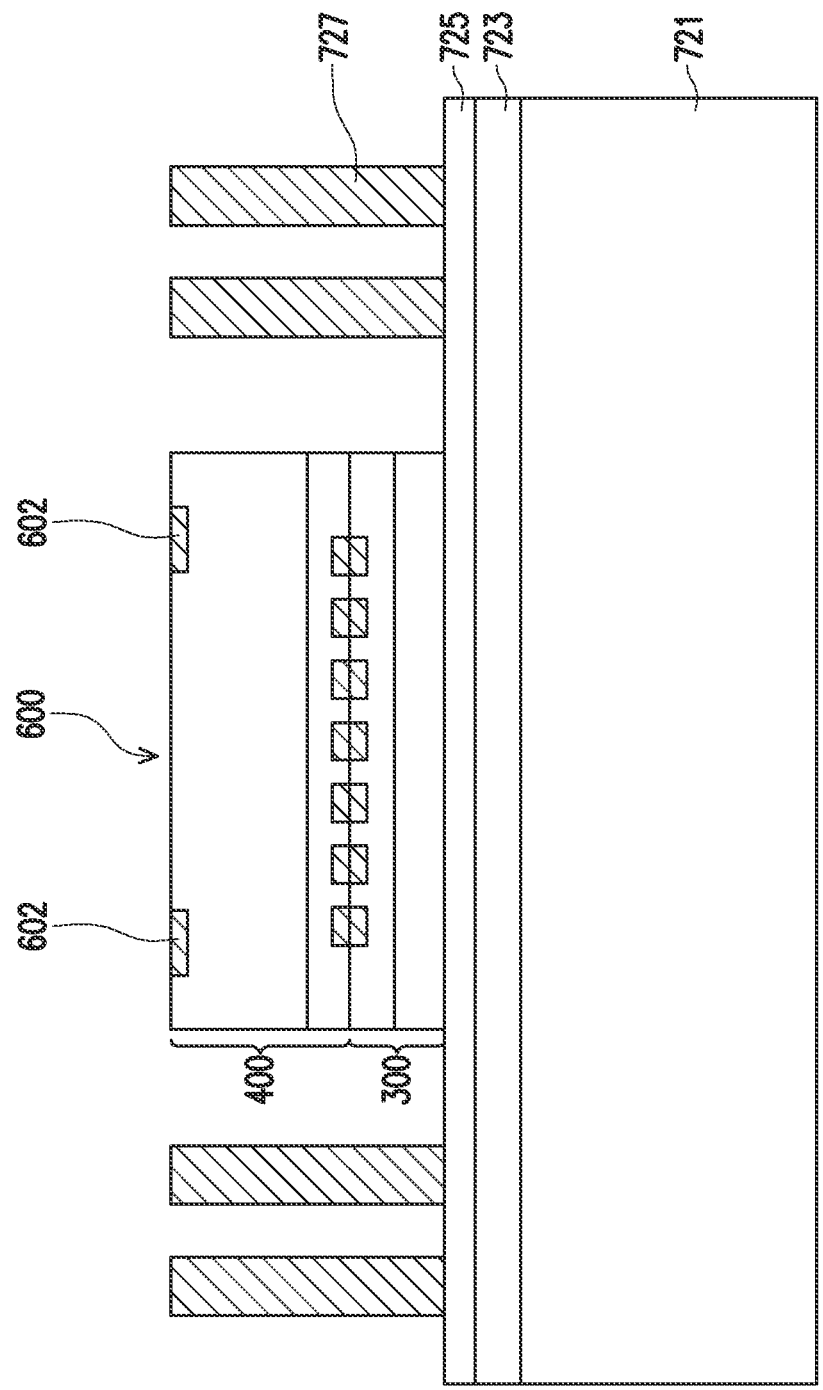
FIGS. 22-26 illustrate cross-sectional views of intermediate steps in a process for forming a package structure, in accordance with some embodiments.

FIGS. 22-26 illustrate intermediate steps in the formation of a package structure 1000 including a package 600, in accordance with some embodiments. FIG. 22 illustrates a first die structure 300 and a second die structure 400 that have been bonded into a package 600. The first die structure 300 and a second die structure 400 may be similar to the first die structure 300 or the second die structure 400 described previously for FIGS. 17-21. The package 600 may be similar to packages 500, 510, 520, or 530 described previously for FIGS. 18A-21, except that external connectors 420 are not formed on the second die structure 400. As shown in FIG. 22, the package 600 includes contact pads 602 formed on the second die structure 400, which allow for electrical connections to be made to the package 600.

FIG. 22 also illustrates a carrier substrate 721 with an adhesive layer 723 and a polymer layer 725 over the adhesive layer 723. In some embodiments, the carrier substrate 721 includes, for example, silicon based materials, such as glass or silicon oxide, or other materials, such as aluminum oxide, combinations of any of these materials, or the like. The carrier substrate 721 may be planar in order to accommodate an attachment of devices such as the package 600. The adhesive layer 723 is placed on the carrier substrate 721 in order to assist in the adherence of overlying structures (e.g., the polymer layer 725). In some embodiments, the adhesive layer 723 may include a light to heat conversion (LTHC) material or an ultra-violet glue which loses its adhesive properties when exposed to ultra-violet light. However, other types of adhesives, such as pressure sensitive adhesives, radiation curable adhesives, epoxies, combinations of these, or the like, may also be used. The adhesive layer 723 may be placed onto the carrier substrate 721 in a semi-liquid or gel form, which is readily deformable under pressure.

The polymer layer 725 is placed over the adhesive layer 723 and is utilized in order to provide protection to the package 600. In some embodiments, the polymer layer 725 may be polybenzoxazole (PBO), although any suitable material, such as polyimide or a polyimide derivative, may alternatively be utilized. The polymer layer 725 may be placed using, e.g., a spin-coating process to a thickness of between about 2 μm and about 15 μm, such as about 5 μm, although any suitable method and thickness may alternatively be used.

In some embodiments, through-vias such as through-dielectric vias (TDVs) 727 are formed over the polymer layer 725. In some embodiments, a seed layer (not shown) is first formed over the polymer layer 725. The seed layer is a thin layer of a conductive material that aids in the formation of a thicker layer during subsequent processing steps. In some embodiments, the seed layer may include a layer of titanium about 500 Å thick followed by a layer of copper about 3,000 Å thick. The seed layer may be created using processes such as sputtering, evaporation, or PECVD processes, depending upon the desired materials. Once the seed layer is formed, a photoresist (not shown) may be formed and patterned over the seed layer. The TDVs 727 are then formed within the patterned photoresist. In some embodiments, the TDVs 727 include one or more conductive materials, such as copper, tungsten, other conductive metals, or the like, and may be formed, for example, by electroplating, electroless plating, or the like. In some embodiments, an electroplating process is used wherein the seed layer and the photoresist are submerged or immersed in an electroplating solution. Once the TDVs 727 have been formed using the photoresist and the seed layer, the photoresist may be removed using a suitable removal process. In some embodiments, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer. Once the TDVs 727 have been formed, exposed portions of the seed layer are then removed, for example, using a wet or dry etching process. The TDVs 727 may be formed to a height of between about 180 μm and about 200 μm, with a critical dimension of about 190 μm and a pitch of about 300 μm.

After forming the TDVs 727, the package 600 is attached onto the polymer layer 725. In some embodiments, the package 600 may be placed using, e.g. a pick-and-place process. However, any suitable method of placing the package 600 may be utilized.

Figure 23:
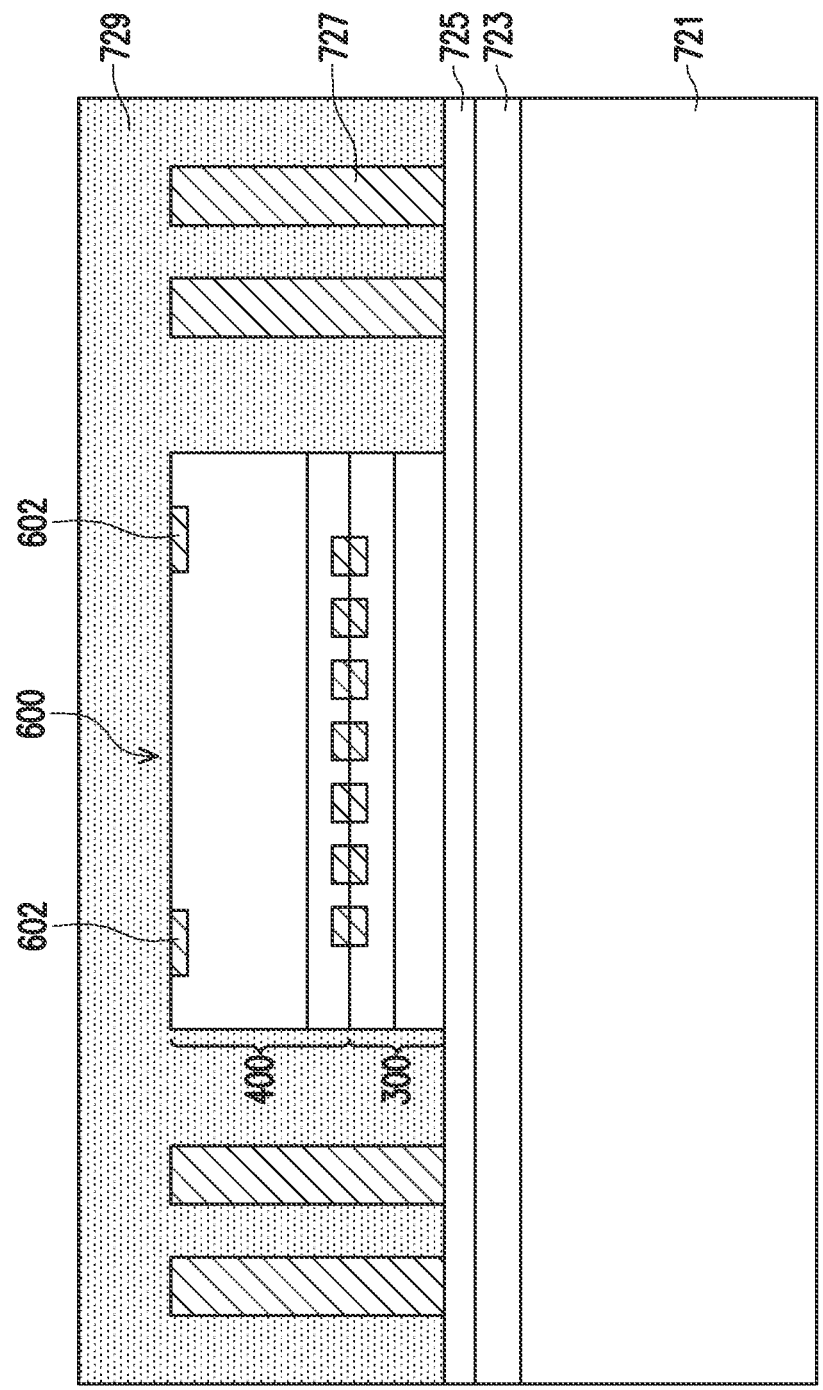
Figure 24:
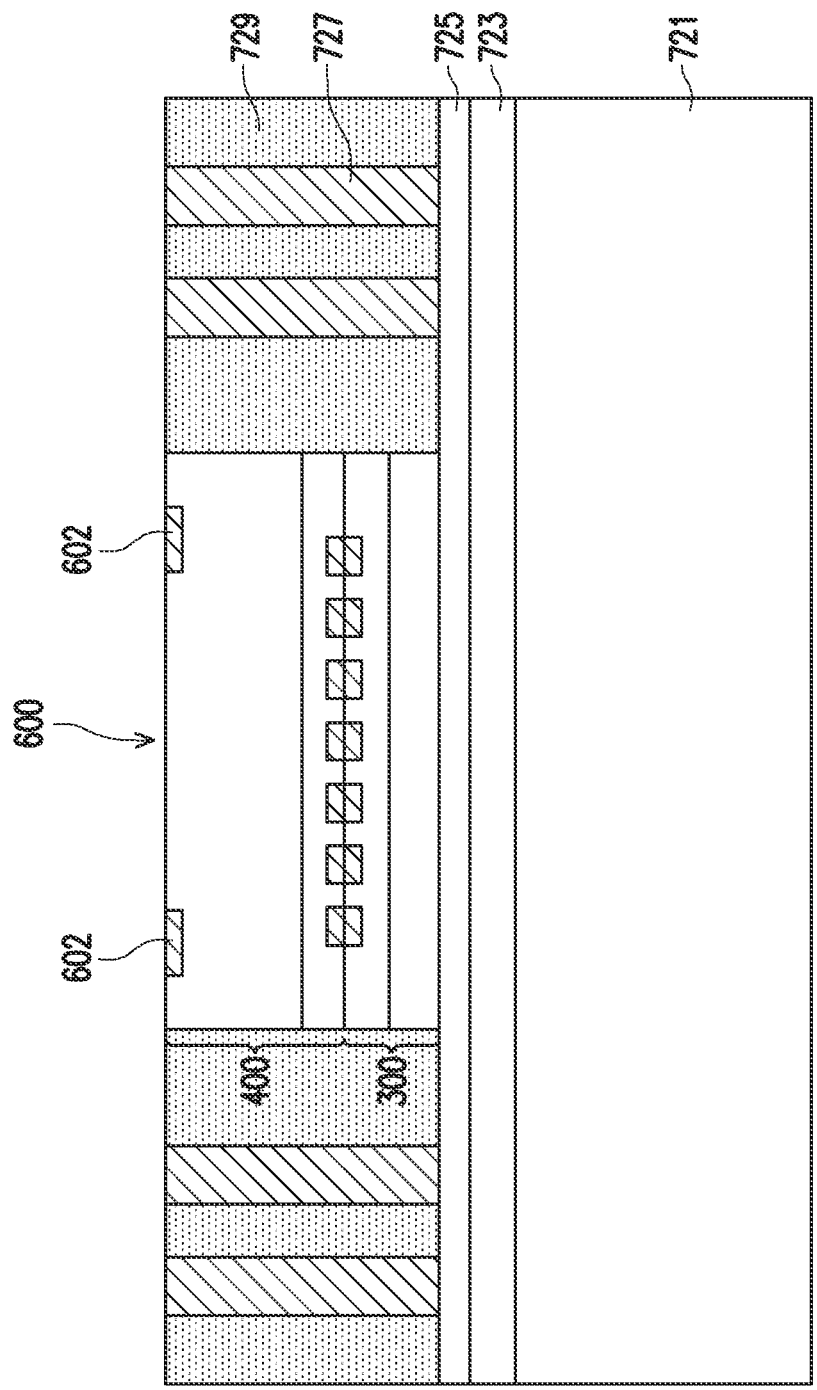

FIG. 23 illustrates an encapsulation of the package 600 and the TDVs 727 with an encapsulant 729. The encapsulant 729 may be a molding compound such as a resin, polyimide, PPS, PEEK, PES, a heat resistant crystal resin, combinations of these, or the like. FIG. 24 illustrates a thinning of the encapsulant 729 in order to expose the TDVs 727 and the package 600. The thinning may be performed, e.g., using a CMP process or another process. The thinning of the encapsulant 729 may expose the contact pads 602 of the package 600.

Figure 25:
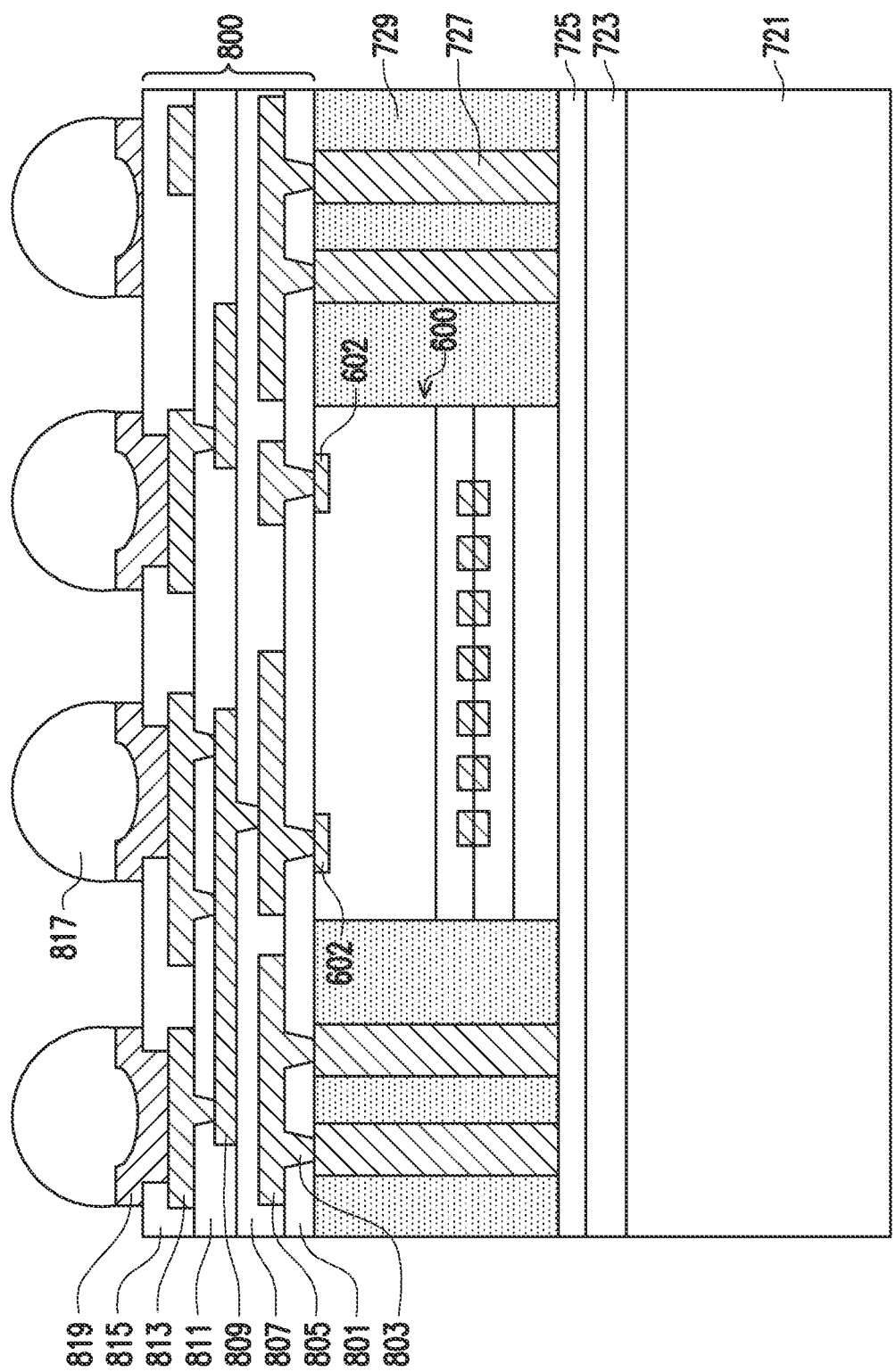

FIG. 25 illustrates a formation of a redistribution structure 800 with one or more layers over the encapsulant 729. In some embodiments, the redistribution structure 800 may be formed by initially forming a first redistribution passivation layer 801 over the encapsulant 729. In some embodiments, the first redistribution passivation layer 801 may be polybenzoxazole (PBO), although any suitable material, such as polyimide or a polyimide derivative, such as a low temperature cured polyimide, may alternatively be utilized. The first redistribution passivation layer 801 may be placed using, e.g., a spin-coating process to a thickness of between about 5 µm and about 17 µm, such as about 7 µm, although any suitable method and thickness may alternatively be used.

Once the first redistribution passivation layer 801 has been formed, first redistribution vias 803 may be formed through the first redistribution passivation layer 801 in order to make electrical connections to the package 600 and the TDVs 727. For example, the first redistribution vias 803 may be formed to make electrical contact with the contact pads 602. In some embodiments the first redistribution vias 803 may be formed by using a damascene process, a dual damascene process, or another process. After the first redistribution vias 803 have been formed, a first redistribution layer 805 is formed over and in electrical connection with the first redistribution vias 803. In some embodiments the first redistribution layer 805 may be formed by initially forming a seed layer (not shown) of a titanium copper alloy through a suitable formation process such as CVD or sputtering. A photoresist (also not shown) may than be formed to cover the seed layer, and the photoresist may then be patterned to expose those portions of the seed layer that are located where the first redistribution layer 805 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 4 µm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 805.

After the first redistribution layer 805 has been formed, a second redistribution passivation layer 807 may be formed and patterned to help isolate the first redistribution layer 805. In some embodiments the second redistribution passivation layer 807 may be similar to the first redistribution passivation layer 801, such as by being a positive tone PBO, or may be different from the first redistribution passivation layer 801, such as by being a negative tone material such as a low-temperature cured polyimide. The second redistribution passivation layer 807 may be placed to a thickness of about 7 µm. Once in place, the second redistribution passivation layer 807 may be patterned to form openings using, e.g., a photolithographic masking and etching process or, if the material of the second redistribution passivation layer 807 is photosensitive, exposing and developing the material of the second redistribution passivation layer 807. However, any suitable material and method of patterning maybe utilized.

After the second redistribution passivation layer 807 has been patterned, a second redistribution layer 809 may be formed to extend through the openings formed within the second redistribution passivation layer 807 and make electrical connection with the first redistribution layer 805. In some embodiments the second redistribution layer 809 may be formed using materials and processes similar to the first redistribution layer 805. For example, a seed layer may be applied and covered by a patterned photoresist, a conductive material such as copper may be applied onto the seed layer, the patterned photoresist may be removed, and the seed layer may be etched using the conductive material as a mask. In some embodiments the second redistribution layer 809 is formed to a thickness of about 4 µm. However, any suitable material or process of manufacture may be used.

After the second redistribution layer 809 has been formed, a third redistribution passivation layer 811 is applied over the second redistribution layer 809 in order to help isolate and protect the second redistribution layer 809. In some embodiments the third redistribution passivation layer 811 may be formed of similar materials and in a similar fashion as the second redistribution passivation layer 807 to a thickness of about 7 µm. For example, the third redistribution passivation layer 811 may be formed of PBO or a low-temperature cured polyimide that has been applied and patterned as described above with respect to the second redistribution passivation layer 1007. However, any suitable material or process of manufacture may be utilized.

After the third redistribution passivation layer 811 has been patterned, a third redistribution layer 813 may be formed to extend through the openings formed within the third redistribution passivation layer 811 and make electrical connection with the second redistribution layer 809. In some embodiments the third redistribution layer 813 may be formed using materials and processes similar to the first redistribution layer 805. For example, a seed layer may be applied and covered by a patterned photoresist, a conductive material such as copper may be applied onto the seed layer, the patterned photoresist may be removed, and the seed layer may be etched using the conductive material as a mask. In some embodiments the third redistribution layer 813 is formed to a thickness of 5 µm. However, any suitable material or process of manufacture may be used.

After the third redistribution layer 813 has been formed, a fourth redistribution passivation layer 815 may be formed over the third redistribution layer 813 in order to help isolate and protect the third redistribution layer 813. In some embodiments the fourth redistribution passivation layer 815 may be formed of similar materials and in a similar fashion as the second redistribution passivation layer 807. For example, the fourth redistribution passivation layer 815 may be formed of PBO or a low-temperature cured polyimide that has been applied and patterned as described above with respect to the second redistribution passivation layer 807. In some embodiments the fourth redistribution passivation layer 815 is formed to a thickness of about 8 µm. However, any suitable material or process of manufacture may be utilized.

In other embodiments, the redistribution vias and redistribution layers of the redistribution structure 800 may be formed using a damascene process, such as a dual-damascene process. For example, a first redistribution passivation layer may be formed over the encapsulant 729. The first redistribution passivation layer is then patterned using one or more photolithographic steps to form both openings for vias and openings for conductive lines within the first redistribution passivation layer. A conductive material may be formed in the openings for vias and the openings for conductive lines to form the first redistribution vias and the first redistribution layer. Additional redistribution passivation layers may be formed over the first redistribution passivation layer, and additional sets of redistribution vias and conductive lines may be formed in the additional redistribution passivation layers as described for the first redistribution passivation layer, forming the redistribution structure 800. This or other techniques may be used to form the redistribution structure 800.

FIG. 25 additionally illustrates a formation of underbump metallizations 819 and third external connectors 817 to make electrical contact with the third redistribution layer 813. In some embodiments the underbump metallizations 819 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 819. Any suitable materials or layers of material that may be used for the underbump metallizations 819 are fully intended to be included within the scope of the embodiments.

In some embodiments, the underbump metallizations 819 are created by forming each layer over the third redistribution layer 813 and along the interior of the openings through the fourth redistribution passivation layer 815. The forming of each layer may be performed using a plating process, such as electrochemical plating, although other processes of formation, such as sputtering, evaporation, or PECVD process, may be used depending upon the desired materials. The underbump metallizations 819 may be formed to have a thickness of between about 0.7 μm and about 10 μm, such as about 5 μm.

In some embodiments the third external connectors 817 may be placed on the underbump metallizations 819 and may be a ball grid array (BGA) which comprises a eutectic material such as solder, although any suitable materials may alternatively be used. In some embodiments in which the third external connectors 817 are solder balls, the third external connectors 817 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape. Once the third external connectors 817 have been formed, a test may be performed to ensure that the structure is suitable for further processing.

Figure 26:
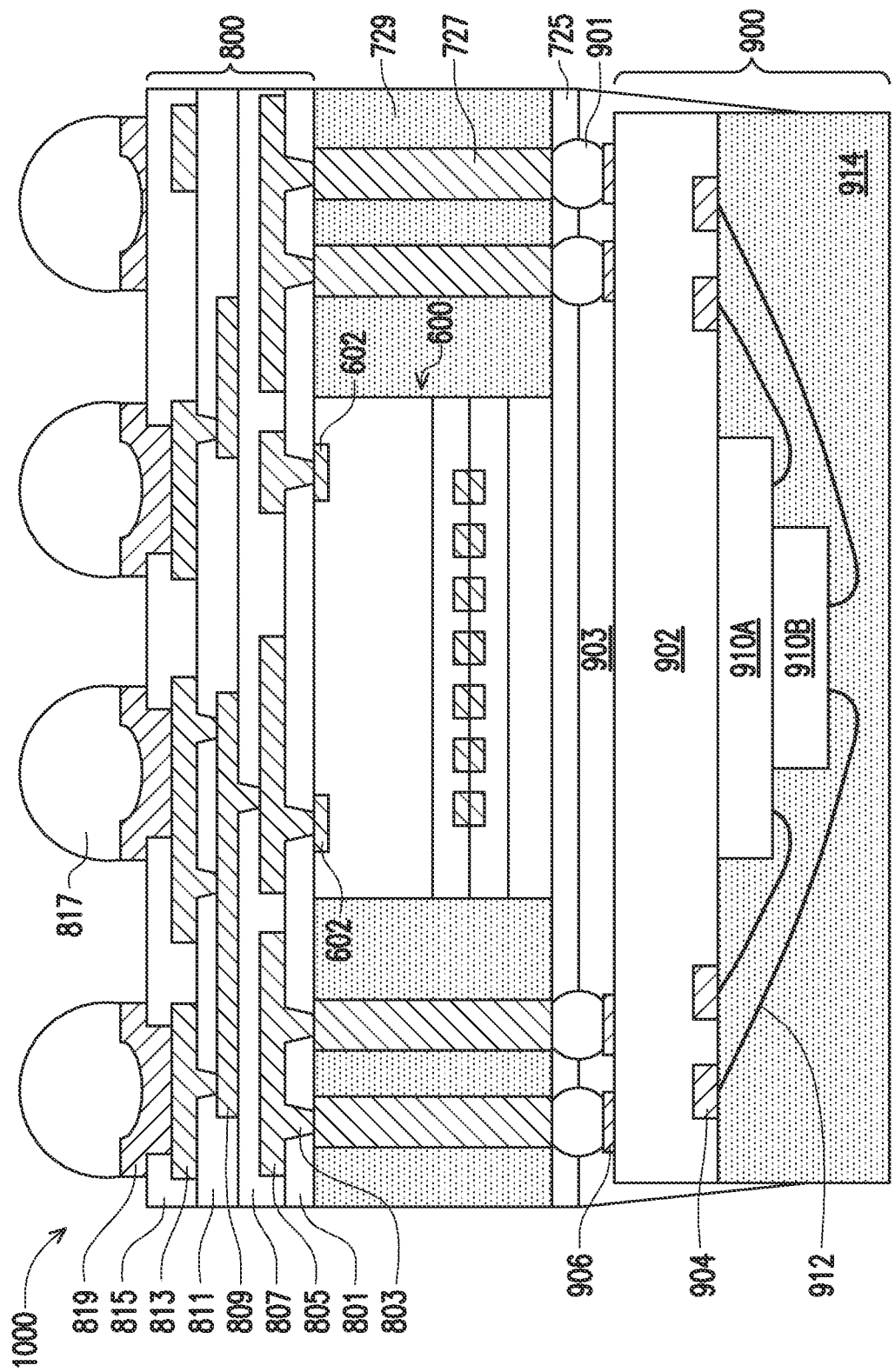

FIG. 26 illustrates a bonding of a device package 900 to the TDVs 727 through the polymer layer 725. Prior to bonding the device package 900, the carrier substrate 721 and the adhesive layer 723 are removed from the polymer layer 725. The polymer layer 725 is also patterned to expose the TDVs 727. In some embodiments, the polymer layer 725 may be patterned using, e.g., a laser drilling method. In such a method a protective layer, such as a light-to-heat conversion (LTHC) layer or a hogomax layer (not separately illustrated) is first deposited over the polymer layer 725. Once protected, a laser is directed towards those portions of the polymer layer 725 which are desired to be removed in order to expose the underlying TDVs 727. During the laser drilling process the drill energy may be in a range from 0.1 mJ to about 30 mJ, and a drill angle of about 0 degree (perpendicular to the polymer layer 725) to about 85 degrees to normal of the polymer layer 725. In some embodiments the patterning may be formed to form openings over the TDVs 727 to have a width of between about 100 μm and about 300 μm, such as about 200 μm.

In another embodiment, the polymer layer 725 may be patterned by initially applying a photoresist (not individually illustrated) to the polymer layer 725 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 725 are removed with, e.g., a dry etch process. However, any other suitable method for patterning the polymer layer 725 may be utilized.

In some embodiments, the device package 900 includes a substrate 902 and one or more stacked dies 910 (e.g., 910A and 910B) coupled to the substrate 902. Although one set of stacked dies 910A/910B is illustrated, in other embodiments, a plurality of stacked dies 910 (each having one or more stacked dies) may be disposed side-by-side coupled to a same surface of the substrate 902. The substrate 902 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 902 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 902 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 902.

The substrate 902 may include active and passive devices (not shown). A wide variety of devices such as transistors, capacitors, resistors, combinations of these, and the like may be used to generate the structural and functional requirements of the design for the device package 900. The devices may be formed using any suitable methods.

The substrate 902 may also include metallization layers or conductive vias (not shown). The metallization layers may be formed over the active and passive devices and are designed to connect the various devices to form functional circuitry. The metallization layers may be formed of alternating layers of dielectric (e.g., low-k dielectric material)

and conductive material (e.g., copper) with vias interconnecting the layers of conductive material and may be formed through any suitable process (such as deposition, damascene, dual damascene, or the like). In some embodiments, the substrate 902 is substantially free of active and passive devices.

The substrate 902 may have bond pads 904 on a first side of the substrate 902 to couple to the stacked dies 910, and bond pads 906 on a second side of the substrate 902, the second side being opposite the first side of the substrate 902, to couple to the external connections 901. In some embodiments, the bond pads 904 and 906 are formed by forming recesses (not shown) into dielectric layers (not shown) on the first and second sides of the substrate 902. The recesses may be formed to allow the bond pads 904 and 906 to be embedded into the dielectric layers. In other embodiments, the recesses are omitted as the bond pads 904 and 906 may be formed on the dielectric layer. In some embodiments, the bond pads 904 and 906 include a thin seed layer (not shown) made of copper, titanium, nickel, gold, palladium, the like, or a combination thereof. The conductive material of the bond pads 904 and 906 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 904 and 906 is copper, tungsten, aluminum, silver, gold, the like, or a combination thereof.

In an embodiment, the bond pads 904 and bond pads 906 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 904 and 906. Any suitable materials or layers of material that may be used for the bond pads 904 and 906 are fully intended to be included within the scope of the current application. In some embodiments, the conductive vias extend through the substrate 902 and couple at least one of the bond pads 904 to at least one of the bond pads 906.

In the illustrated embodiment, the stacked dies 910 are coupled to the substrate 902 by wire bonds 912, although other connections may be used, such as conductive bumps. In an embodiment, the stacked dies 910 are stacked memory dies. For example, the stacked dies 910 may be memory dies such as low-power (LP) double data rate (DDR) memory modules, such as LPDDR1, LPDDR2, LPDDR3, LPDDR4, or the like memory modules.

The stacked dies 910 and the wire bonds 912 may be encapsulated by a molding material 914. The molding material 914 may be molded on the stacked dies 910 and the wire bonds 912, for example, using compression molding. In some embodiments, the molding material 914 is a molding compound, a polymer, an epoxy, silicon oxide filler material, the like, or a combination thereof. A curing process may be performed to cure the molding material 914. The curing process may be a thermal curing, a UV curing, the like, or a combination thereof.

In some embodiments, the stacked dies 910 and the wire bonds 912 are buried in the molding material 914, and after the curing of the molding material 914, a planarization step, such as a grinding, is performed to remove excess portions of the molding material 914 and provide a substantially planar surface for the device package 900.

In some embodiments, external connections 901 may be formed to provide an external connection between the device package 900 and, e.g., the TDVs 727. The external connections 901 may be contact bumps such as microbumps or controlled collapse chip connection (C4) bumps and may comprise a material such as tin, or other suitable materials, such as silver or copper. In some embodiments in which the external connections 901 are tin solder bumps, the external connections 901 may be formed by initially forming a layer of tin through any suitable method such as evaporation, electroplating, printing, solder transfer, ball placement, or the like, to a thickness of, e.g., about 100 μm. Once a layer of tin has been formed on the structure, a reflow is performed in order to shape the material into the desired bump shape.

Once the external connections 901 have been formed, the external connections 901 are aligned with and placed over the TDVs 727, and a bonding is performed. For example, in some embodiments in which the external connections 901 are solder bumps, the bonding process may comprise a reflow process whereby the temperature of the external connections 901 is raised to a point where the external connections 901 will liquefy and flow, thereby bonding the device package 900 to the TDVs 727 once the external connections 901 resolidify. An encapsulant 903 may be formed to encapsulate and protect the device package 900. The encapsulant 903 may extend between the polymer layer 725 and the device package 900 and may be an underfill in some embodiments. In this manner, a package structure 1000 may be formed.

Embodiments may achieve advantages. By forming the bond pad vias (BPVs) and the bond pads of a die in two separate processing steps, the size and/or separation (e.g., pitch) of features such as metal lines, conductive pads, the BPVs, and/or the bond pads may be reduced. For example, by forming the BPVs in a first photolithography and etching step, the BPVs may be formed closer to other features such as conductive pads (e.g., aluminum pads) without an increased chance of process defects such as electrical shorts. In this manner, the size of a die or a package incorporating the die may be reduced. Additionally, the routing density of the die or the package may be increased. In some cases, a first bond pad of a first die may be formed such that its entire bonding surface is bonded to the corresponding second bond pad of a second die, even when misalignment occurs during the bonding process. For example, the first bond pad of the first die may have a width that is smaller than the second bond pad, so the entire bonding surface of the first bond pad remains contacting the second bond pad even with some misalignment present between the first bond pad and the second bond pad. In this manner, a package incorporating bonded dies may have improved contact resistance between bonded pads when misalignment occurs.

In an embodiment, a device includes an interconnect structure over a semiconductor substrate, the interconnect structure including first conductive pads, a first dielectric layer over the interconnect structure, bond pad vias within the first dielectric layer, each bond pad via of the bond pad vias including a first barrier layer extending along sidewalls of the first dielectric layer and over a first conductive pad of the first conductive pads, and a first conductive material over the first barrier layer, wherein a top surface of the first conductive material and a top surface of the first barrier layer are coplanar, a second dielectric layer over the first dielectric layer, and first bond pads within the second dielectric layer, each first bond pad including a second barrier layer extending along sidewalls of the second dielectric layer and on the first conductive material and the first barrier layer of a first bond pad via of the bond pad vias, wherein the second barrier layer fully covers the top surface of the first conductive material and the top surface of the first barrier layer of the first bond pad via, and a second conductive material over the second barrier layer. In an embodiment, the device further includes a third dielectric layer extending over sidewalls of the first dielectric layer, the interconnect structure, and the semiconductor substrate. In an embodiment, the second dielectric layer extends over the third dielectric layer and the first dielectric layer. In an embodiment, the device further includes an aluminum pad within the first dielectric layer, wherein the aluminum pad contacts a first conductive pad of the first conductive pads. In an embodiment, a bond pad via contacts the aluminum pad. In an embodiment, the device further includes a passivation layer extending over the first conductive pads, the bond pad vias extending through the passivation layer. In an embodiment, adjacent first conductive pads are laterally separated by a distance that is between 2 μm and 20 μm. In an embodiment, the second barrier layer includes titanium, titanium nitride, tantalum, or tantalum nitride.

In an embodiment, a package includes a first die that includes a first metallization layer, one or more first bond pad vias on the first metallization layer, wherein a first barrier layer extends across the first metallization layer between each first bond pad via and the first metallization layer, and one or more first bond pads on the one or more first bond pad vias, wherein a second barrier layer extends across each first bond pad via between a first bond pad and the first bond pad via, and a second die including one or more second bond pads, wherein a second bond pad is bonded to a first bond pad of the first die. In an embodiment, the first die includes a first bonding layer, the first bond pad is disposed within the first bonding layer, the second die comprises a second bonding layer, the second bond pad is disposed within the second bonding layer, and the first bonding layer is bonded to the second bonding layer. In an embodiment, a width of the first bond pad is between 95% and 150% of a width of the second bond pad. In an embodiment, a width of the second bond pad is between 95% and 150% of a width of the first bond pad. In an embodiment, the second die further includes a through via, wherein the through via is bonded to the first bond pad of the first die. In an embodiment, the package further includes a conductive pad on the first metallization layer, wherein the conductive pad comprises a different conductive material than the one or more first bond pad vias. In an embodiment, the conductive pad is laterally separated from an adjacent first bond pad via by a distance that is between 2 μm and 100 μm.

In an embodiment, a method includes forming an interconnect structure on a top surface of a semiconductor substrate, the interconnect structure including a first conductive pad, forming a first dielectric layer over the interconnect structure, etching the first dielectric layer to form a first opening exposing the first conductive pad, depositing a first barrier layer within the first opening in the first dielectric layer, depositing a first conductive material within the first opening and on the first barrier layer, forming a second dielectric layer over the first dielectric layer, etching the second dielectric layer to form a second opening exposing the first conductive material, depositing a second barrier layer within the second opening in the second dielectric layer, depositing a second conductive material within the second opening and on the second barrier layer, and bonding a semiconductor die to the second dielectric layer, the semiconductor die including a bonding layer and a bond pad, wherein the bonding bonds the bonding layer of the semiconductor die to the second dielectric layer and bonds the bond pad of the semiconductor die to the second conductive material. In an embodiment, the method includes, after depositing the first conductive material, forming a sacrificial layer over the first dielectric layer and the first conductive material, attaching the sacrificial layer to a first carrier structure, thinning the semiconductor substrate, and removing the first carrier structure and the sacrificial layer, wherein the second dielectric layer is formed over the first dielectric layer after the sacrificial layer is removed. In an embodiment, the method includes forming a passivation layer over the interconnect structure and forming a conductive pad over the passivation layer, wherein the first dielectric layer is formed over the conductive pad and the passivation layer. In an embodiment, the bond pad of the semiconductor die has a lateral width that is less than that of the second conductive material. In an embodiment, the bond pad of the semiconductor die has a lateral width that is greater than that of the second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    an interconnect structure over a first semiconductor substrate, the interconnect structure comprising a plurality of first conductive pads;
    a first dielectric layer over the interconnect structure;
    a plurality of bond pad vias within the first dielectric layer, wherein the plurality of bond pad vias couple to corresponding ones of the plurality of first conductive pads;
    a first bonding layer over the first dielectric layer;
    a conductive pad in the first dielectric layer, wherein the first dielectric layer separates the conductive pad and the first bonding layer; and
    a plurality of first bond pads within the first bonding layer, each first bond pad of the plurality of first bond pads comprising:
        a first barrier layer extending along sidewalls of the first bonding layer and on the plurality of bond pad vias; and
        a first conductive material over the first barrier layer, wherein the first barrier layer extends between corresponding ones of the plurality of bond pad vias and the first conductive material.

2. The device of claim 1, wherein each of the plurality of bond pad vias comprises:
    a second barrier layer extending along sidewalls of the first dielectric layer and over corresponding ones of the plurality of first conductive pads; and
    a second conductive material over the second barrier layer, wherein a top surface of the second conductive material and a top surface of the second barrier layer are level.

3. The device of claim 1, further comprising a first molding compound adjacent the first semiconductor substrate, the interconnect structure, and the first dielectric layer.

4. The device of claim 3, further comprising a die structure, the die structure comprising:
 a second semiconductor substrate;
 a second bonding layer; and
 a plurality of second bond pads bonded directly to corresponding ones of the plurality of first bond pads.

5. The device of claim 4, further comprising a second molding compound along sidewalls of the second semiconductor substrate and the second bonding layer.

6. The device of claim 5, wherein the first bonding layer directly contacts the second molding compound.

7. The device of claim 5, further comprising a through via extending through the second molding compound to one of the plurality of first bond pads.

8. The device of claim 7, wherein the die structure further comprises an interconnect structure, wherein the second molding compound is interposed between the interconnect structure and the first bonding layer.

9. The device of claim 1, wherein a bottom surface of the conductive pad is level with a bottom surface of a first bond pad via of the plurality of bond pad vias.

10. A device, comprising:
 a first die structure comprising:
  a first metallization layer, the first metallization layer comprising a plurality of metal pads;
  a first dielectric layer over the first metallization layer;
  one or more first bond pad vias in the first dielectric layer on the first metallization layer, wherein an upper surface of the one or more first bond pad vias is level with an upper surface of the first dielectric layer; and
  one or more first bond pads on the one or more first bond pad vias, wherein a first barrier layer extends between each respective first bond pad via and a respective first bond pad, wherein a bottom surface of each first barrier layer is flat; and
 a substrate comprising one or more second bond pads, wherein a second bond pad is bonded to a first bond pad of the first die structure.

11. The device of claim 10, wherein a second barrier layer extends between each respective first bond pad via and the first metallization layer, wherein the second barrier layer covers sidewalls and a bottom surface of the respective first bond pad via.

12. The device of claim 10, wherein the first die structure further comprises a conductive pad coupled to a first metal pad of the plurality of metal pads, wherein the first dielectric layer extends along sidewalls of the conductive pad, wherein the first dielectric layer completely covers a surface of the conductive pad facing away from the first metallization layer.

13. The device of claim 10, wherein a width of the first bond pad vias is less than a width of the corresponding first bond pads.

14. The device of claim 10, wherein the first die structure further comprises:
 a molding compound adjacent sidewalls of the first dielectric layer; and
 a bonding layer along sidewalls of the one or more first bond pads, wherein the bonding layer extends over a surface of the molding compound opposite the first metallization layer.

15. The device of claim 14, further comprising a conductive pad on the first metallization layer, wherein the conductive pad comprises a different conductive material than the one or more first bond pad vias.

16. A method comprising:
 forming a first dielectric layer over a first substrate;
 etching the first dielectric layer to form a first opening exposing a first conductive pad and a second opening exposing a second conductive pad;
 forming a first bond pad via in the first opening and a second bond pad via in the second opening, wherein an upper surface of the first bond pad via is level with an upper surface of the first dielectric layer and an upper surface of the second bond pad via;
 forming a second dielectric layer over the first dielectric layer;
 etching the second dielectric layer to form a third opening exposing the first bond pad via and a fourth opening exposing the second bond pad via;
 depositing a first barrier layer within the third opening and the fourth opening in the second dielectric layer;
 depositing a first conductive material on the first barrier layer in the third opening and the fourth opening; and
 bonding a second substrate to the second dielectric layer, the second substrate comprising a bonding layer and a bond pad, wherein the bonding bonds the bonding layer of the second substrate to the second dielectric layer and bonds the bond pad of the second substrate to the first conductive material.

17. The method of claim 16, wherein forming the first bond pad via comprises:
 depositing a second barrier layer within the first opening in the first dielectric layer; and
 depositing a second conductive material within the first opening and on the second barrier layer.

18. The method of claim 16, further comprising forming a first molding compound along sidewalls of the first substrate prior to forming the second dielectric layer, wherein forming the second dielectric layer comprises forming the second dielectric layer on a surface of the first molding compound.

19. The method of claim 18, wherein the second substrate comprises:
 a second molding compound; and
 a through via extending through the second molding compound,
 wherein bonding the second substrate comprises bonding the through via to the second bond pad via.

20. The method of claim 19, wherein a width of the first conductive material is greater than a width of the second bond pad via and a width of the through via.

* * * * *